(12) United States Patent
Bormann et al.

(10) Patent No.: US 8,359,561 B2
(45) Date of Patent: Jan. 22, 2013

(54) EQUIVALENCE VERIFICATION BETWEEN TRANSACTION LEVEL MODELS AND RTL AT THE EXAMPLE TO PROCESSORS

(75) Inventors: Joerg Bormann, Pullach (DE); Sven Beyer, Munich (DE); Sebastian Skalberg, Munich (DE)

(73) Assignee: Onespin Solutions GmbH, Munich (DE)

( * ) Notice: Subject to any disclaimer, the term of this patent is extended or adjusted under 35 U.S.C. 154(b) by 970 days.

(21) Appl. No.: 12/275,557

(22) Filed: Nov. 21, 2008

(65) Prior Publication Data

US 2009/0204932 A1 Aug. 13, 2009

Related U.S. Application Data

(60) Provisional application No. 61/103,310, filed on Oct. 7, 2008, provisional application No. 61/027,635, filed on Feb. 11, 2008.

(30) Foreign Application Priority Data

Dec. 6, 2007 (JP) .................................. 2007-315517

(51) Int. Cl.
*G06F 17/50* (2006.01)
(52) U.S. Cl. ........................................................ 716/107
(58) Field of Classification Search .................. 716/106, 716/107
See application file for complete search history.

(56) References Cited

U.S. PATENT DOCUMENTS

| | | | |
|---|---|---|---|
| 5,243,538 A | 9/1993 | Okuzawa et al. | |
| 6,378,112 B1 | 4/2002 | Martin et al. | |
| 6,400,288 B1 | 6/2002 | Fredrickson et al. | |
| 6,581,026 B2 | 6/2003 | Lohse et al. | |
| 6,654,715 B1 | 11/2003 | Iwashita et al. | |
| 6,959,272 B2 | 10/2005 | Wohl et al. | |
| 7,020,854 B2 | 3/2006 | Killian et al. | |
| 7,131,098 B2 | 10/2006 | Darringer et al. | |
| 7,143,375 B2 | 11/2006 | Maruyama et al. | |
| 7,237,210 B2 | 6/2007 | Likovich et al. | |
| 7,356,789 B2 | 4/2008 | Ly et al. | |

(Continued)

FOREIGN PATENT DOCUMENTS

JP 3-156572 7/1991

(Continued)

OTHER PUBLICATIONS

"A Classification and Comparison Framework for Software Architecture Description Languages", Nenad Medvidovic and Richard N. Taylor, Member, IEEE Computer Society.

(Continued)

*Primary Examiner* — Jack Chiang
*Assistant Examiner* — Brandon Bowers
(74) *Attorney, Agent, or Firm* — 24IP Law Group; Timothy R. DeWitt

(57) ABSTRACT

A method for formally verifying the equivalence of an architecture description with an implementation description. The method comprises the steps of reading an implementation description, reading an architecture description, demonstrating that during execution of a same program with same initial values an architecture sequence of data transfers described by the architecture description is mappable to an implementation sequence of data transfers implemented by the implementation description, such that the mapping is bijective and ensures that the temporal order of the architecture sequence of data transfers corresponds to the temporal order of the implementation sequence of data transfers, and outputting a result of the verification of the equivalence of the architecture description with the implementation description.

52 Claims, 8 Drawing Sheets

U.S. PATENT DOCUMENTS

| | | | |
|---|---|---|---|
| 7,412,684 B2 * | 8/2008 | Gutberlet et al. | 716/101 |
| 7,434,184 B2 | 10/2008 | Li | |
| 7,506,286 B2 | 3/2009 | Beardslee et al. | |
| 2001/0016935 A1 | 8/2001 | Furusawa | |
| 2001/0034594 A1 * | 10/2001 | Kohno et al. | 703/14 |
| 2005/0102640 A1 | 5/2005 | Iwamoto et al. | |
| 2006/0130029 A1 | 6/2006 | Morishita et al. | |
| 2006/0265675 A1 | 11/2006 | Wang | |
| 2006/0277019 A1 | 12/2006 | Ganesan et al. | |
| 2007/0143717 A1 * | 6/2007 | Koelbl et al. | 716/3 |

FOREIGN PATENT DOCUMENTS

| | | |
|---|---|---|
| JP | 8-22485 | 1/1996 |
| JP | 10254915 | 9/1998 |
| JP | 20001488808 | 5/2000 |
| JP | 2003-141202 | 5/2003 |
| JP | 2004-38617 | 2/2004 |
| JP | 2004-145712 | 5/2004 |
| JP | 2004-213605 | 7/2004 |
| JP | 2005-316595 | 11/2005 |

OTHER PUBLICATIONS

"Architecture Description Language driven Validation of Processor, Memory, and Co-Processor Pipelines", source(s): Technical Report #01-55; Dept. of Information and Computer Science; University of California.

"A methodology for validation of microprocessors using equivalence checking", source(s): Mishra, P.; Dutt, N.; Microprocessor Test and Verification: Common Challenges and Solutions, 2003. Proceedings. 4th International Workshop on May 29-30, 2003 pp. 83-88.

"A Top-Down Methodology for Microprocessor Validation", source(s): Prabhat Mishra and Nikil Dutt; University of California, Irvine.

"Verification: Verification of behavioral descriptions by combining symbolic simulation and automatic reasoning", source(s): Ghiath AL Sammane, Dominique Borrione, Remy Chevallier; Apr. 2005, Proceedings of the 15th ACM Great Lakes symposium on VLSI GLSVSLI '05.

"Formal verification of behavioral VHDL specifications: a case study", source(s): Félix Nicoli, Laurence Pierre; Sep. 1994, Proceedings of the conference on European design automation EURO-DAC '94.

"A methodology for validation of microprocessors using equivalence checking", source(s): Mishra, P. (Archit. & Compilers for Embedded Syst. Lab., California Univ., Irvine, CA, USA); Dutt, N. Source: Proceedings. 4th International Workshop on Microprocessor Test and Verification—Common Challenges and Solutions, 2003, p. 83-8.

"Formal tools speed RTL debugging. (register-transfer-level)(Special Report on EDA Tools) (Technology Information)", source(s): Pierre Ragon and Dino Caporossi. Electronic Engineering Times n901 (May 13, 1996 n901): pp. 80(1).

"Actuality of Formal Verification Tool—Equivalence checking between behavioural description and RTL description," Design Wave Magazine.

* cited by examiner

Process according to Invention

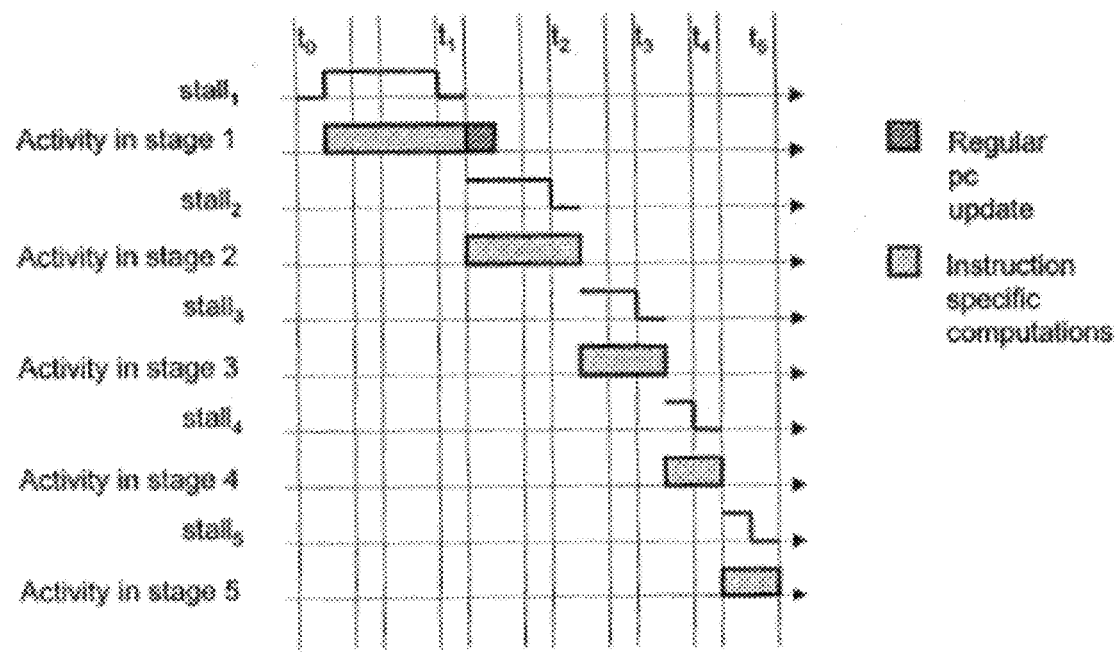
Fig. 2: Timing in property scheme simple_instruction

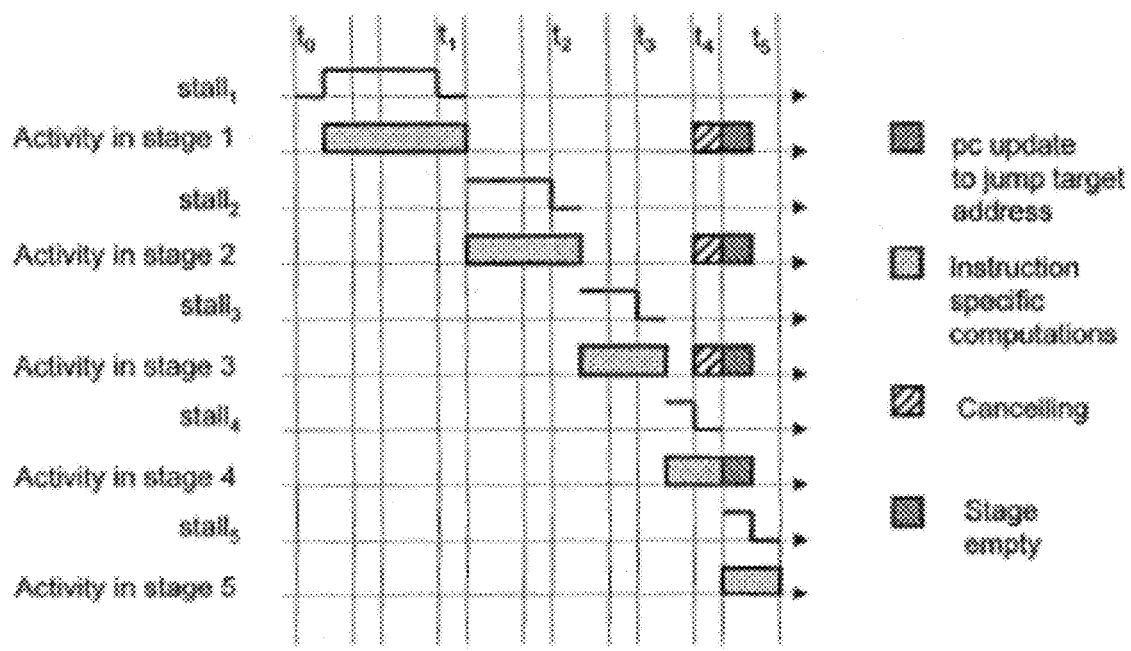
Fig. 3: Timing in property scheme jump_instruction

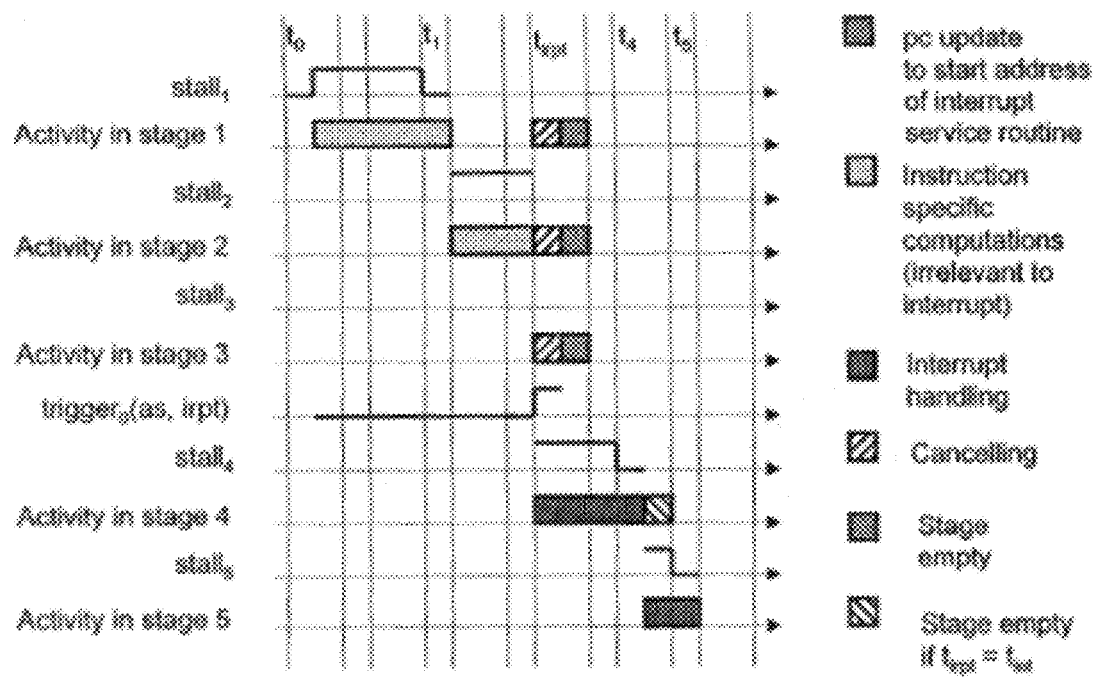
Fig. 4: Timing in property scheme interrupt

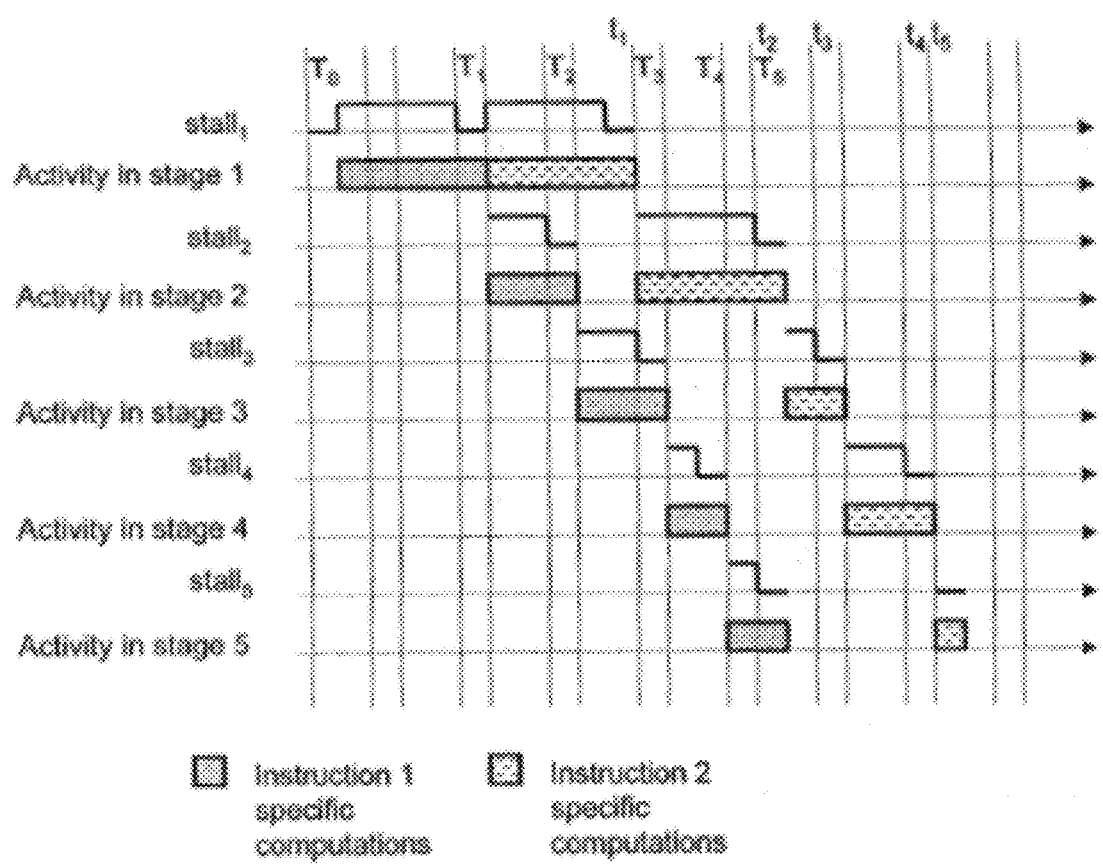
Fig. 5: Timing of two adjacent properties generated from property scheme simple_instruction

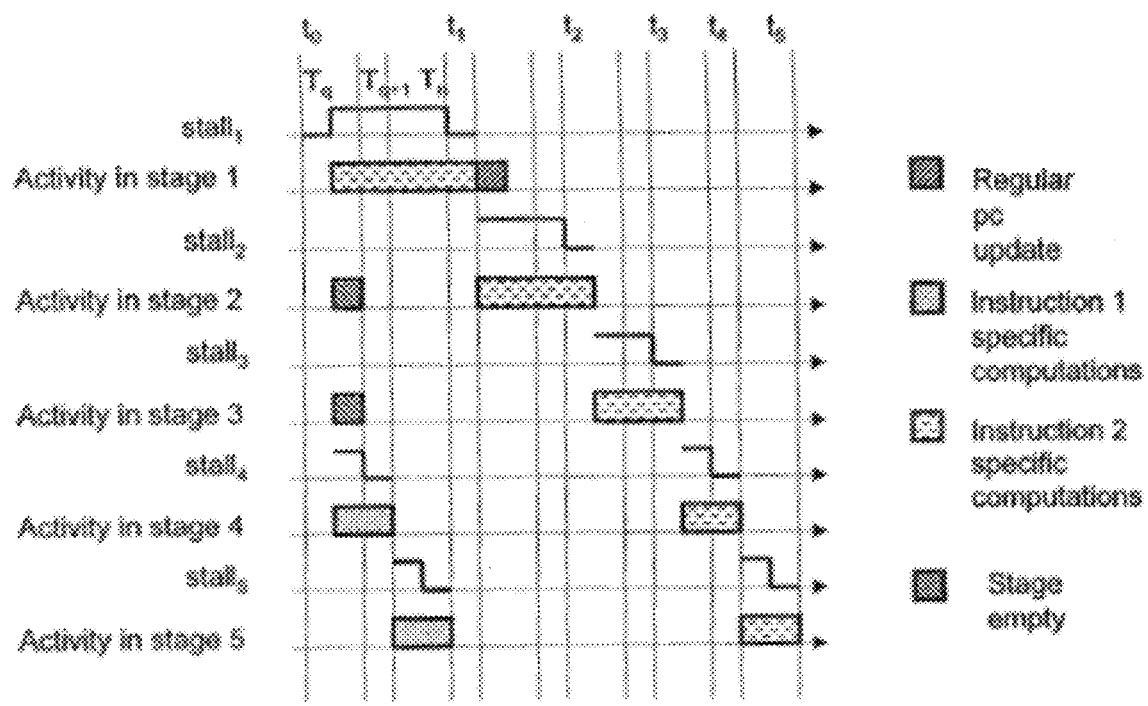
Fig. 6: General timing between two properties, where the first is generated from the property schemes simple_instruction, jump_instruction, or interrupt, and the latter is generated from property scheme simple_instruction or jump_instruction

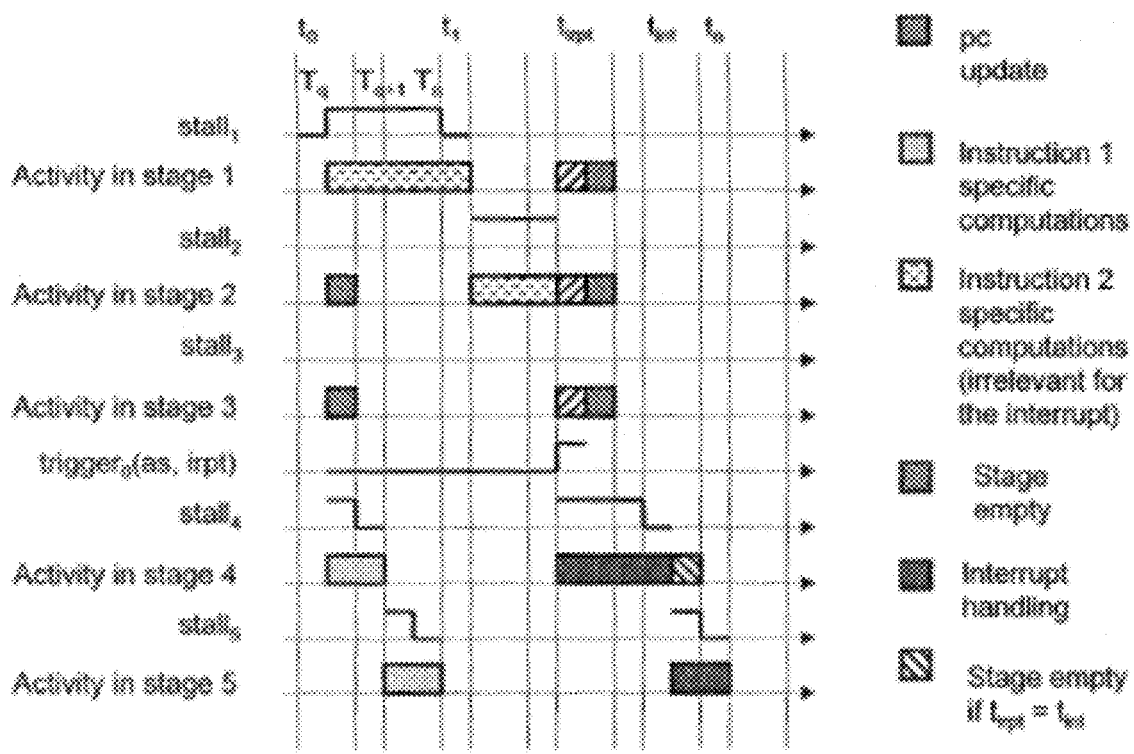
Fig. 7: General timing between two properties, where the first is generated from the property schemes simple_instruction, jump_instruction, or interrupt, and the latter is generated from interrupt.

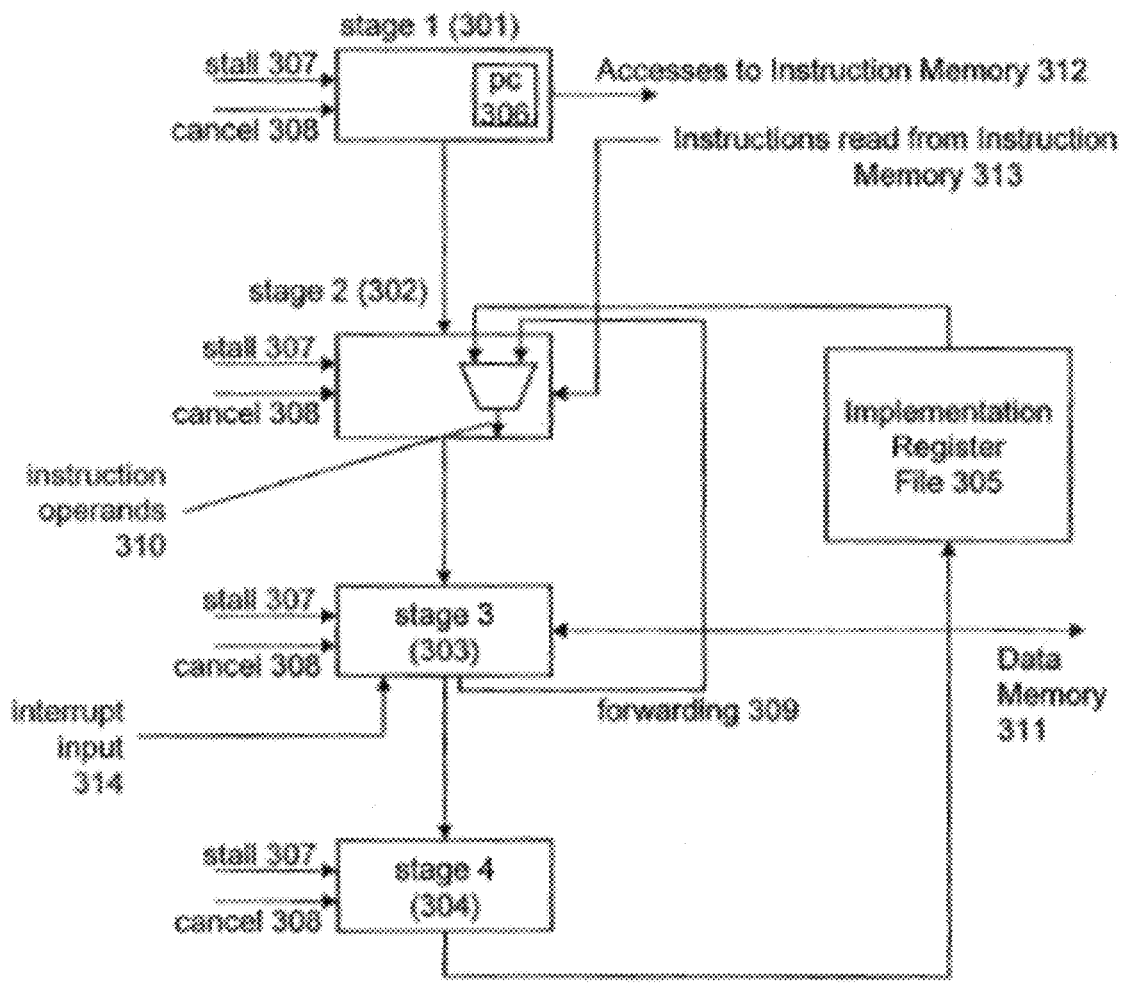
Fig. 8: Example for the pipelined implementation of a processor

EQUIVALENCE VERIFICATION BETWEEN TRANSACTION LEVEL MODELS AND RTL AT THE EXAMPLE TO PROCESSORS

CROSS-REFERENCE TO RELATED APPLICATIONS

The present application claims the benefit of the filing date of U.S. Provisional Patent Application Ser. No. 61/103,310 filed by the present inventors on Oct. 7, 2008 and U.S. Provisional Patent Application Ser. No. 61/027,635 filed by Jorg Bormann, Sven Beyer and Jens Schönherr on Feb. 11, 2008. The aforementioned provisional patent applications are hereby incorporated by reference in their entirety.

STATEMENT REGARDING FEDERALLY SPONSORED RESEARCH OR DEVELOPMENT

None.

BACKGROUND OF THE INVENTION

1. Field of the Invention

The present invention relates to the field of the verification of digital hardware.

2. Brief Description of the Related Art

Functional Hardware Verification

The verification of digital hardware is a step in the production of integrated circuits. If the verification of the digital hardware fails to remove all bugs in the digital hardware, a production process for the digital hardware, with its high fixed costs, may need to be restarted and the introduction of a product incorporating the digital hardware into the marketplace will suffer a delay.

One step in the design process of digital hardware is functional verification, by which the initial description of a circuit of the digital hardware is checked to see whether the circuit always behaves as intended. A description of the circuit is given as an RTL description in some hardware description language (e.g. VHDL, Verilog, or SystemVerilog). Current verification methods typically do not identify all of the functional bugs in a design of the circuit. The reasons why the functional bugs remain undetected can be classified as follows:

Unstimulated Bugs: These functional bugs are not found because the stimuli applied to the design of the circuit fail to exercise and propagate the unstimulated bugs to the inputs of a checker of the circuit.

Overlooked Bugs These functional bugs are stimulated and propagated to the inputs of the checker but the checker is not designed to identify the overlooked bugs.

Falsely Accepted Bugs: These functional bugs arise from a consistent misinterpretation of a specification of the design of the circuit by the implementers and the verification engineers.

Verification by Simulation

The work horse for functional verification is simulation. Simulation-based verification methods are prone to all three classes of the undetected bugs. Simulation fails to stimulate all of the functional bugs because of the factor of $10^6$ or more between the simulator speed and the real-time execution of the circuit under test. Consequently, the simulation cannot deploy all of the stimuli necessary to exhaustively verify the design of the circuit in the project time available. Simulation coverage metrics do not relieve this situation—the simulation coverage metrics can only assist in the allocation of restricted verification capacity across the design of the circuit.

The problem of the overlooked bugs is therefore generally handled by verification planning. Verification tasks are identified by examination of the specification of the circuit and the architecture, by relating common design patterns to appropriate assertions, or by asking the designers of the circuit to note particularly important relations between signals in the circuit. The completeness of the resulting verification tasks is typically compromised by human error. Therefore, practitioners keep this verification planning "dynamic" throughout the verification phase in order to capture new insight into unmet verification needs.

Formal Functional Verification

Formal verification is regarded as an alternative to simulation-based verification. In formal functional verification, so-called properties are proven against the design of the circuit to ensure proper operation of the RTL description. The formal verification uses methods of mathematical proof and therefore acts as though the circuit has been stimulated with all possible input stimuli. See, Browne, Clarke, Dill, Mishra: "Automatic Verification of Sequential Circuits Using Temporal Logic." Therefore, in the terms of the classification above, the formal verification leads to an avoidance of unstimulated bugs in the design after the formal verification has been completed.

Formal verification has recently been complemented by an approach to ensure that a set of the properties precisely examines the entire input/output behaviour of the circuit. The set of properties is then termed "complete". In the terms of the classification above it avoids overlooked bugs in the design after the verification.

Formal Equivalence Verification

Besides formal functional verification, there is formal equivalence verification. The goal of the formal equivalence verification is to verify process steps of the design after the RTL description has been designed and verified. The verification of these design process steps requires the comparison of the circuit description before and after the design process step. For example, to verify a synthesis step, the RTL description is formally compared with a synthesized net list. Due to its simple user interface, equivalence checking today is the most widely used approach for comparing two descriptions of the same design.

Algorithms used in the formal equivalence verification compare two descriptions of the same design by extracting an automaton from each of these descriptions, by identifying pairs of corresponding input bits, output bits, and state bits in the two automata, and then comparing the next state and output functions of corresponding state and output bits in the two descriptions. This is referred to as combinational equivalence verification. Combinational equivalence verification is only applicable if both circuit representations have the same state encoding.

Processor Verification

General Task

Processors are typically developed such that programmers writing assembler code to be executed by the processor do not need to understand a hardware description of the processor in detail. Instead, it suffices for the programmer to view the processor as though one instruction had been fully executed before the processor begins with the execution of the next instruction. This model of the processor is called the architecture or architecture description of the processor and will be described in more detail below.

For reasons of efficiency, the processors are implemented in a way that the processors execute multiple instructions simultaneously, e.g. in a pipeline. This requires that sequentializing mechanisms are designed which make pipeline effects invisible to the user or which secure efficient operation of the processor. Such sequentializing mechanisms are for example forwarding, stalling, or speculative execution and will be described below. These sequentializing mechanisms are represented in the RTL description of the processor. The RTL description will be referred to as the implementation description below.

The verification problem for the processors is to show that the implementation indeed executes the programs in the way that the architecture suggests. This verification problem is a functional verification task, as the functional verification task verifies the RTL description including the sequentializing mechanisms. However, this functional verification task can also be viewed as an equivalence verification task between two descriptions of the same circuit, namely the architecture description and the implementation description. Still, this equivalence verification task goes far beyond the approaches of the equivalence verification tasks currently known. The reason for this is that the design step that turns the architecture description of the processor into the implementation description involves human creativity and the introduction of elaborate mechanisms such as pipelining, forwarding, speculative execution of instructions, or stalling. In particular, architecture description and implementation description of the processor differ in the timing of the circuit. The time difference between the completion of one instruction in the implementation description of the processor and the next instruction in the same processor can vary widely. In superscalar processors, the execution of one instruction may even overtake the execution of other instructions in the superscalar processor, such that the order of completion of the instruction execution is different from the sequence of instructions of the program. The detailed temporal relation between the architecture description and the implementation description is typically not important to the programmers. They are interested in a gross average throughput of instructions when writing their programs.

The equivalence verification between the implementation description and the architecture description of a processor is exacerbated by interrupts. An interrupt arrives at the processor when the processor receives appropriate values on an input signal. Depending on an internal state of the processor, the processor decides if it accepts the interrupt or not. Upon acceptance of an interrupt, the processor will execute the interrupt. This interrupt execution typically replaces the execution of an instruction, the execution of which was already started by the processor. Part of the interrupt execution is to switch to the execution of another part of the program, the interrupt service routine.

During implementation, a decision is made by the designers regarding which of the instructions that the processor executes when an interrupt arrives should be replaced by the execution of the interrupt. This decision must be accounted for during the equivalence verification.

Processor Verification

In industrial processor verification, the general idea for simulation-based verification is to make both the implementation description and the architecture description execute the same program and then to compare the traffic in the communication between the processor and the data memory in both the implementation description and the architecture description. This approach executes the processor verification by examining the implementation and the architecture based on what is observable at the respective interfaces. Bugs are found when the traffic to the memory of the implementation and the architecture deviate from one another.

Programs used to verify the processor are fed into the architecture description and the implementation description. The programs are either specially developed, randomly generated, or derived from application programs, e.g. the booting of an operation system.

A problem arising from this so-called "black box" approach is related to interrupts. The comparison requires that the interrupts arrive at the implementation description and the architecture description at corresponding points in time. The exact correspondence between the interrupts in the implementation description and the architecture description is often manually provided by a verification engineers which is tedious and error prone.

Often, the simulation-based verification not only examines the processor through its interface signals, but also checks that properties about the relation of internal signals hold. These internal signal properties are temporal logic expressions that are expected to be satisfied for every clock cycle of the implementation and are commonly referred to as assertions. The verification approach using the assertions is termed Assertion Based Verification. The assertions are often provided by the design engineers who develop the implementation description. If the properties are not satisfied, the simulation issues an error or warning message which allows the designer to identify a bug long before the bug becomes observable at the interface signals of the processor.

Once a certain level of confidence in the implementation of the processor is reached, self testing programs are also applied which calculate certain results using two different sequences of instructions and compare these certain results.

However, as discussed earlier, simulation-based approaches suffer from the risk of undetected bugs, either because the undetected bugs were not stimulated or have been overlooked.

Most application of formal verification concentrates on the formal examination of properties which in principle identifies all contradictions to the properties. However formal verification does not account for the underlying problem that the properties may overlook bugs in the sense of the above bug classification.

The application of formal verification to processors has already been studied in academia. Burch and Dill developed an idea of control path verification, i.e. verification of those parts in simple pipelines that decide upon how the processor combines which data. See Jerry R. Burch, David L. Dill: Automatic verification of Pipelined Microprocessor Control. CAV 1994: 68-80. However, Burch and Dill did not consider data paths at all, i.e. those parts that actually transfer or combine the data depending on the signals from the control path. The present invention allows for the verification of the entire processor, including the control paths and the data paths. Several extensions to super-scalar or out-of-order processors have been developed. However, the approaches described in these papers only focus on specific parts of specific designs, i.e., they do not offer a complete verification of the implementation description against the architecture description. In addition, automation is typically low and there is no integration with efficient debug environments, as provided in the invention.

The most advanced approach to processor verification is based on the completeness approach. To this end, properties that capture the architecture description must be written. These properties are to be proven against the design. It must be shown using the completeness checker that the properties do not overlook bugs. This ensures that upon complete formal verification, no unstimulated or overlooked bugs remain in the design.

SUMMARY OF THE INVENTION

Formal Verification on an Already Designed Implementation

The invention describes a formal verification for the processors that leads to a high quality level with less user input. Instead of developing properties, the designer must only provide the architecture description, protocol information for the communication on a data and instruction bus, and so-called correspondence information that capture information available during the design process. The clear structure of required user inputs allows the formalization, e.g. of the architecture description, in a single work step, which greatly reduces the risk of falsely accepting bugs.

The correspondence information is deployed by the method in a failsafe manner: Even if unsuitable correspondence information is provided, verification will not falsely claim that the architecture and the implementation are equivalent. It is to be noted that unsuitable correspondence information can make the verification wrongly report a difference.

Formal Verification in Parallel to the Design of the Implementation

The resultant verification process can be applied after the processor is fully designed as described in the state of the art. In addition to this post hoc verification, the invention also enables the verification process in parallel with the design process. It allows a step-by-step processor development using a formal proof to verify every step.

This approach complements processor development tools that generate the software required to develop programs for the processor from the architecture description [SCLA+04] [SHNB+04], as e.g.

Simulator
Debugger
Assembler
Disassembler
Linker
Compilers

Simulation

The method of the invention requires the generation of properties. These generated properties can also be checked in a simulation based approach which is a standard procedure in Assertion Based Verification. This has several benefits over the approach to simulate the architecture description and the implementation description and then to compare the memory traffic in both architecture description and the implementation description:

- A clear and straight-forward mapping of the interrupts of the implementation to the interrupts of the architecture
- The identification of the sequence of instructions that the processor executes
- If a bug disturbs the execution of an instruction or an interrupt, the bug will be found when the simulator executes the implementation description and evaluates the property that describes the execution of the instruction or the implementation. This is earlier than in the approaches according to state of the art and therefore allows easy debugging. In the state of the art approaches the impact of a bug can be stored in the processor state for a long time before the bug becomes observable which results in ensuing difficulties to locate the bug.
- The verification is provably not prone to overlooking bugs in the sense of the classification of undetected bugs.

With these characteristics, the approach goes far beyond typical Assertion Based Verification approaches.

TERMINOLOGY AND NOTATION

The Temporal Logic ITL

The invention will be described in the temporal logic ITL which will be presented in the following. However, the invention is not limited to this temporal logic. The procedure of the invention can also be applied using all other linear temporal logics, such as LTL, PSL or SVA.

The temporal logic is used for the description of the relationship between behavioural aspects of the implementation description by means of properties. In the following representation, a slight modification of the ITL language, the input language of a property checker [BS01] will be used. In this language, temporal aspects are described by referring to time points. Such time points correspond to cycles in synchronous digital circuits.

The core of ITL is comprised of logical lines of one of the following three forms at <time point>: <Boolean condition>;
during [<time point$_1$>, <time point$_2$>]: <Boolean condition>;
within [<time point$_1$>, <time point$_2$>]: <Boolean condition>;

The first form requires the validity of the Boolean condition at the time point specified, the second for all time points in the interval and the third for at least one time point in the interval. If the interval is empty, the second form is fulfilled trivially and the third is not fulfilled trivially.

A Boolean condition at a specific time point T is evaluated for normal operators by evaluating the partial expressions at time T and combining them according to the operator. This evaluation decomposes the partial expressions, until some partial expression is given by some signal, in which case that value of that signal at time T is used. To evaluate a partial expression of the form next(Term, n) or prev(Term, n) the expression Term will be executed at a time point T+n or T−n, respectively. In order to evaluate a partial expression of the form Term @ T', the term Term is evaluated at the point in time T'.

For Boolean expressions, the less or equal operator is written <=, the greater or equal operator is written >=, inequality is written /=, implication is denoted by ->. Intervals are written [a, b] and include the boundaries. For Boolean results, the values 1 and true will be used synonymously, as well as the values 0 and false.

Time points are specified relative to an arbitrary but fixed point in time t, or relative to a time variable, which is itself defined relative to t. Time variables are declared by means of a list of expressions $$T_1 = B_1 + n_1 .. m_1,$$
$$T_2 = B_2 + n_2 .. m_2,$$
....;

In these expressions, the $B_i$ are either t or another temporal variable $T_j$ with j<i declared in the above list. An allowed assignment of values to time variables must fulfil the conditions given above, that is $B_i+n_i<=T_i<=B_i+m_i$ must be true. $m_i$ can be infinity, in which case the respective declaration is replaced by $$T_i >= B_i + n_i$$
or
$$T_i > B_i + n_i$$

Time variables are used to describe how the circuit under examination synchronizes with its environment. For this, expressions of the form

```
during [B_i + n_i, T_i − 1]:    signal /= value;
at      T_i:                    signal = value;
``` are used to set a time variable $T_i$.

Logical lines form conditions as follows: In the simplest case, a condition represents a logical line. The succession of two conditions corresponds to their conjunction.

The expression

```
for each j in m .. n:
    Condition(j)
end for each;
``` formed from a parameterized condition should be treated like

```
Condition(m);
Condition(m+1);
...
Condition(n);
```

It should be the trivially holding condition true, if n<m.

For Boolean expressions, the expression

```
for each j in m .. n:
    Expression(j)
end for each;
``` should be treated like

```
Expression(m) and
Expression(m+1) and
... and
Expression(n);
```

Partial expressions up to conditions can be summarized in macros, which can have parameters if necessary.

A property has the form

```
property <name>;
for timevars: <time variable declaration>;
assume:
    <condition 1>;
prove:
    <condition 2>;
end property;
```

<condition 1> is referred to as the assume part, <condition 2> as the proof part of the property. Parts of the assume part will be referred to as assumptions. The property is satisfied, if for all values of t and for all values of the time variables as specified in the <time variable declaration> for which the assume part is satisfied, the proof part is also satisfied. A counter example shows behaviour of the implementation description, a point of time t, and a set of values for the time variables as specified in the <time variable declaration>, that satisfy the assume part but violate the prove part.

The logical lines that form an assume part or proof part may be interrupted by cut points of the form "<"<label>">". In this case, separate proofs will be executed for every one of the <label> in the assumption. The resultant property is derived by cutting off all ensuing lines in the assume and the proof part. The resulting property will be called a partial property and referred to by <property_name>.<label>.

If a property contains an entry "dependencies:" the Boolean macros specified in this entry are to be treated as assumptions for all time points after the reset.

left_hook and right_hook are optional entries to the properties. These entries refer to time points with expressions of the form t+<offset> or <TimeVariable>+<offset>. The entries describe, how the properties form chains to match an execution trace in the way described in the next section.

TERMINOLOGY

The term property will be used for a temporal logic expression that describes behavioural relations between aspects of the circuit behaviour. The examination by a formal verification tool is called a proof. If the formal verification tool decides that the property holds, the circuit shows the behavioural relation for every one of the input stimuli to the circuit. If there is at least one input stimulus that leads to a circuit behaviour that contradicts the behavioural relation, the formal verification tool decides that the property fails. Properties can also be examined by simulation, in which case it cannot be demonstrated that the property holds, because simulation is not strong enough to examine all input stimuli. However, simulation is sufficient to show that a property fails. To examine a property against a design description by a simulator, the design description is simulated with the simulator, and the simulator evaluates the property on the sequences of values generated with the simulator. If the evaluation shows that the property fails, an error message is emitted by the simulator.

An execution trace of a circuit is a sequence of values on its inputs, outputs, and internal signals that the circuit can create according to its hardware description. A counter example is an execution trace that contradicts a property.

A property is said to match an execution trace for some given instantiation of time variables (including "t"), if both assume and prove part are satisfied by the execution trace for the given instantiation of time variables. If an execution trace is generated by some circuit, and if a property is proven to hold on that circuit, then it suffices to check that the assume part matches to decide whether the whole property matches.

A property chain is a sequence of properties $P_0, P_1, P_2, \ldots$. A property chain is said to match an execution trace, if there is an instantiation of all time variables in the properties $P_0, P_1, P_2, \ldots$, such that the properties match the execution trace and such that left hook of property $P_{i+1}$ equals the right hook of property $P_i$ for every $i >= 0$.

An expression E is said to "depend" on some variable V, if V occurs in the syntax that forms the expression E, no matter if V really contributes to the result of the expression. For example, the expression "V and not V or W" depends on V and W.

In a preferred embodiment, the present invention is a method for formally verifying the equivalence of an architecture description with an implementation description. The method comprises the steps of reading an implementation description, reading an architecture description, demonstrating that during execution of a same program with same initial values an architecture sequence of data transfers described by the architecture description is mappable to an implementation sequence of data transfers implemented by the implementation description, such that the mapping is bijective and ensures that the temporal order of the architecture sequence of data transfers corresponds to the temporal order of the implementation sequence of data transfers, and outputting a result of the verification of the equivalence of the architecture description with the implementation description. The mapping of the architecture sequence of data transfers to the implementation sequence of data transfers may comprise ensuring that the same data is transferred from or to same address of a data memory. The implementation sequence of data transfers may be described by an access protocol description. The step of demonstrating may comprise during the execution of the same program, behaviour of interrupt signals of the implementation description is demonstrated to be mappable to behaviour of interrupt signals of the architecture description such that the mapping of the architecture sequence signals of data transfers with the mapped interrupt signals corresponds to the implementation sequence of data transfers influenced by the interrupt signals. The step of may also or alternatively comprise the steps of reading correspondence information and generating a plurality of demonstration steps using the read correspondence information, wherein one of the demonstration steps verifies a correspondence of the architecture description with the implementation description subsequent to the execution of a cycle of the same program. The method may use the correspondence information in a way such that the method does not output a false verification for a non-equivalent pair of the architecture description and the implementation description. The correspondence information may include stall conditions of one or multiple pipeline stages of the implementation description, cancel conditions of one or multiple pipeline stages of the implementation description, a classification of one or more of pipeline stages of the implementation description and/or a function for reading a program counter from the implementation description.

The correspondence information may comprise one or more virtual registers for mapping values in implementation registers of the implementation description to corresponding architectural registers of the architectural description. The one or more virtual registers may be functions for testing one or more pipeline stages of the implementation description in the order of an instruction sequence, wherein the one or more virtual registers return at least one pipeline value from one of the one or more pipeline stages having relevant data and wherein the one or more virtual registers return, if none of the one or more pipeline stages have relevant data, the value of the implementation register implementing the corresponding architecture register. The one or more virtual registers may be functions generated from one or more sub-functions. The virtual registers may be organized in virtual register files.

The demonstration may further comprise checking that each one of cycles of the same program is implemented by a finite number of implementation clock cycles. The cycle of the same program may comprise an instruction or an interrupt.

The step of generating the plurality of demonstration steps may comprise the steps of generating properties and verifying the generated properties to either prove all of the generated properties or to identify at least one false one of the generated properties. The step of generating properties may comprise the steps of accessing a property schemata including one or more place holders and replacing the one or more place holders with values from the correspondence information, to thereby generate at least one generated property. The method may cease on the identification of at least one false one of the generated properties. A subset of the generated properties may be created, such that each member property of the subset describes an execution of one of an implementation cycle. The implementation cycle may be either an instruction executed by the implementation description or an interrupt executed by the implementation description. For each one of an implementation cycle there may exist at least one property describing the implementation cycle. The subset of the generated properties may indicate changes in one or more virtual registers as a result of the execution of the implementation cycles. The subset of the generated properties may consist of properties to verify how the implementation requests an instruction, when and how the implementation changes a program counter; if, when and how instruction in the pipeline are cancelled; if, when and which ones of the data transfers of the implementation description are carried out by the implementation; that subsequent to the execution of the instruction the implementation is in a state from which it executes a further implementation cycle.

The result of the method may comprise one of: indication of the proof of all of the generated properties, confirmation of the equivalence of the architecture description and the implementation description, and an indication that one of the generated properties is false or a list of the false ones of the generated properties.

The architectural description may be an architecture description of a processor and the implementation description may be the implementation description of a processor.

The step of reading the implementation description may comprise reading a first portion of the implementation description, the step of reading the architecture description comprises reading a first portion of the architecture description, and the method may further comprise the step of using the correspondence information to verify the equivalence of the first portion of the implementation description with the first portion of the architecture description and, if the equivalence is demonstrated, reading in a further portion of the implementation description and a further portion of the architecture description.

In another embodiment, the present invention is a virtual register file that comprises a definition for every stage of a pipeline using signals of an implementation, wherein, when a stage starts executing an instruction, the virtual register file returns one of a special "invalid" value and a value that a corresponding architecture register file has when an architecture description starts executing the instruction.

In still another embodiment, the present invention is a method for verifying the equivalence of an architecture description with an implementation description. The method comprises the steps of reading an implementation description, reading an architecture description, reading correspondence information, generating a set of properties, verifying the set of properties to either show that all of the generated properties hold or to identify at least one false one of the generated properties, and outputting a result of the verification of the equivalence of the architecture description with the implementation description. The verifying demonstrates that during execution of a same program with same initial values an architecture sequence of data transfers described by the architecture description is mapped to an implementation sequence of data transfers implemented by the implementation description, such that the mapping is bijective and ensures that the temporal order of the architecture sequence of data transfers corresponds to the temporal order of the implementation sequence of data transfers. The verifying the set of properties comprises simulating the implementation properties on a result of the simulation. The mapping of the architecture sequence of data transfers to the implementation sequence of data transfers comprises ensuring that the same data is transferred from or to same address of a data memory. The implementation sequence of data transfers is described by an access protocol description. The demonstrating may comprise during the execution of the same program, behaviour of interrupt signals of the implementation description is demonstrated to be mappable to behaviour of interrupt signals of the architecture description.

In yet another embodiment, the present invention is a method for the generation of a full set of functional coverage points for simulation based verification of a processor implementation. The method comprises the steps of reading the architecture description, reading an access protocol description, reading correspondence information, generating a set of coverage points, turning the set of coverage points into simulation monitors and including the simulation monitors in a simulation.

Still other aspects, features, and advantages of the present invention are readily apparent from the following detailed description, simply by illustrating a preferable embodiments and implementations. The present invention is also capable of other and different embodiments and its several details can be modified in various obvious respects, all without departing from the spirit and scope of the present invention. Accordingly, the drawings and descriptions are to be regarded as illustrative in nature, and not as restrictive. Additional objects and advantages of the invention will be set forth in, part in the description which follows and in part will be obvious from the description, or may be learned by practice of the invention.

BRIEF DESCRIPTION OF THE DRAWINGS

For a more complete understanding of the present invention and the advantages thereof, reference is now made to the following description and the accompanying drawings, in which:

FIG. 2 shows the timing in the property scheme simple instruction.

FIG. 3 shows the timing relation of the jump instruction.

FIG. 4 shows the timing structure of a possible generated interrupt property.

FIG. 5 shows two of the main properties $P_j$ and $P_{j+1}$ generated from the property schemata simple instruction.

FIG. 6 shows the general case of the property generated from property schemata's reset.

FIG. 7 shows the general case of one of the properties generated from the property schemata's.

FIG. 8 shows the design of a processor

DETAILED DESCRIPTION OF THE PREFERRED EMBODIMENTS

Conceptual Background of the Invention

Architecture Description

Figure 1:
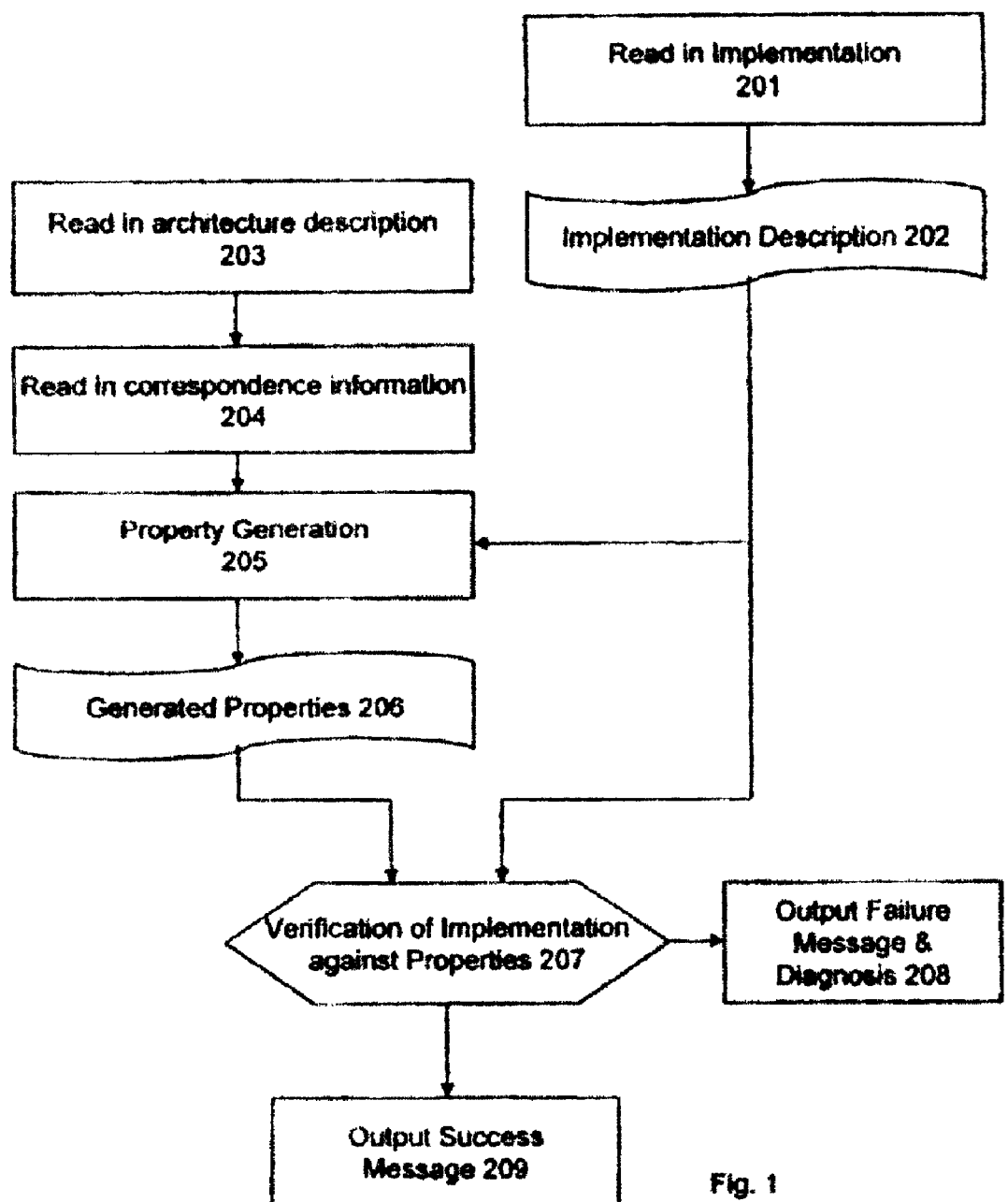
FIG. 1 shows an exemplary process according to the invention.

The architecture description of a processor presents a view provided by, for example, the programmer's manual. The architecture description takes the view of the processor in which the processor executes every instruction fully before the processor starts with the next instruction. The architecture description can therefore be viewed as a synchronous automaton that executes one instruction in every clock cycle. Besides instructions, the architecture also executes interrupts.

Interrupts are signalled to the architecture description by the architecture interrupt signals. If the processor accepts an interrupt, the processor executes the interrupt instead of the instruction. The execution of one interrupt or one instruction will be termed an "architecture cycle".

The interface of the architecture is given by signals that communicate with the data memory or the instruction memory, by interrupt signals, and the reset signal. The state of the architecture description typically contains a program counter that provides the address of the instruction to be executed.

one or multiple register files upon which the instructions act. These register files are arrays of registers and may degenerate to a single register. The register files store, for example, data with which the processor deals. Another example is the program status word with Boolean variables that provide information about the last execution of an instruction (e.g., a Boolean variable to highlight that the last instruction execution generated an overflow, or a Boolean variable to show that the result of the last instruction is zero). The register files may also store information required to decide upon acceptance of interrupts or to execute interrupts as e.g. the interrupt priority, an interrupt mask (to switch off some interrupts) etc.

The instructions of the architecture description can be classified into simple instructions and jump instructions. For simple instructions, the program counter is updated similarly to a counter. Jump instructions often specify a condition about the state of the architecture description. During the execution of jump instructions, the condition will be evaluated on the state of the architecture description. If the condition is satisfied, the architecture program counter will be set to some fresh value specified in the instruction. In the case that the condition of the jump instruction is satisfied the jump is referred to as being "taken". If the condition is not satisfied, the jump is referred to as being "not taken". In this latter case the architecture program counter is updated such as the update by a simple instruction.

Similarly, the execution of an interrupt makes the architecture description set the architecture program counter to the start address of the interrupt service routine.

Implementation

Processors are typically not implemented by the automaton described in the architecture description. Instead, the instruction execution is pipelined. The RTL implementation is therefore capable of handling multiple ones of the instructions simultaneously, each ones of the instructions being in different phases of their execution. A common class of processors consists of one pipeline, and this is the class upon which the invention will be exemplified. FIG. 8 shows such a processor consisting of a single pipeline. It should be noted that the invention is not limited to such pipelines.

The pipeline is said to consist of stages 1 ... n. Stage 1 301 is chosen, such that stage 1 contains the program counter. The execution of an instruction consists of phases and each phase is executed in one stage of the pipeline stages. For example, stage 1 issues the read request to the instruction memory 312. Stage 2 302 receives the instruction 313 that the instruction memory returns. Furthermore, stage 2 reads the operands 310 that an instruction is going to combine.

Stage 3 303 combines the operands according to the instruction specification. This gives a result that is stored in stage 4 304 until the result is written back to the implementation register file 305.

An instruction is executed by the implementation by moving along the pipeline stages and executing the related phases of the instruction execution. It is said that an instruction is in a stage when the signals that implement this stage are controlled by the execution of the instruction. Therefore, the instruction is first in stage 1, then the instruction moves to stage 2, then to stage 3 and so forth until the instruction reaches the last pipeline stage, at which the instruction execution is finished. If an instruction is allowed to move from a stage s to the next stage s+1 is determined by stall signals 307. If the stall signals are 0, the instruction may move from stage s to the next pipeline stage, otherwise the instruction has to remain in the pipeline stage s.

Processor pipelines execute interrupts by replacing the execution of an instruction with the execution of an interrupt that is signalled by interrupt inputs 314. Some stage is designed such that it is responsible for accepting an interrupt, and if the interrupt is accepted, the execution of the instruction in that stage and the execution of all instructions in stages with lower stage numbers is cancelled by activating the cancel signals 308. Cancelling means that the processor acts after the cancelling, as if the instructions had never been present. The interrupt is then executed in phases instead of the highest instruction that is cancelled.

The execution of one instruction or of one interrupt will be referred to as an implementation cycle. A program cycle shall be the collective term for an implementation or an architecture cycle Processor implementations contain register files which will be referred to as the implementation register files 305. These implementation register files will be updated with the results of an implementation cycle when the instruction execution or interrupt execution is in the stage 304 at which this update should happen. This stage is referred to as the writeback stage of the implementation register file. The operands for an instruction are generally read from the implementation register file. Exceptions are related to pipeline hazard that will be described below.

Results of the instructions are often computed in a stage before the writeback stage. Then the result needs to be shifted through the stages between the stage where the result is computed and the writeback stage. This is done by some of the signals that implement the stages.

Because of this shifting of the result through the pipeline stages, the result is written back into an implementation register file 305 some time after the result was created. This may lead to the situation that an instruction after the instruction that generated the result needs the result before the result is written into the implementation register file. This situation is referred to as a pipeline hazard. To resolve the pipeline hazard, special forwarding hardware 309 is required to make such results still residing in the pipeline available to the next instruction. If the result is not yet produced, the execution of the second instruction must be delayed. This is achieved by stalling the pipeline.

Most jump instructions of a processor are conditional, i.e. a condition decides whether the PC is incremented in the normal way or is set to a new address. Consequently, the processor is uncertain about the next instruction after the jump until the condition is executed. The execution of the condition may be in a later stage. To avoid wasting time, the processor may speculate about the next instructions and remove them if the condition execution shows that this speculation is incorrect. This removal is achieved by cancelling the instruction from the stages. Cancelling also ensures that interrupts modify the sequence of instructions appropriately.

Equivalence

The invention verifies the equivalence between the architecture description and the implementation description. The exact notion of equivalence will be presented here.

To define the equivalence between the architecture description and the implementation description, the architecture description will be treated like a synchronous circuit that executes exactly one instruction or interrupt every clock cycle (referred to as an architecture cycle). The architecture cycles will be numbered starting with the architecture state AS @1 after reset. After the i-th (i=1, 2, 3, ...) architecture cycle, the processor is in architecture state AS @ i+1.

The architecture description and the implementation description start from equal reset states and execute the same program, i.e. both obtain the same instructions from the same addresses of the instruction memory. Moreover, the data memories initially store the same data at the same addresses, such that the architecture description and the implementation description receive the same data from the same data memory addresses until the architecture description and the implementation description write to these addresses. As long as no interrupts arrive, the implementation description is said to be equivalent to the architecture description if both the architecture description and the implementation description create the same sequence of requests to the data memory for every possible program stored in the instruction memory. This means, that there must be a mapping from the sequence of data transfers described by the architecture description to the sequence of data transfers described by the implementation description. This mapping must map the i-th data transfer of the architecture description to the i-th data transfer of the implementation description. The mapping must ensure that every data transfer described by the architecture description and the mapped data transfer of the implementation description execute the data transfers in the same direction, to the same address, and they transfer the same data in case of write requests.

If such a mapping exists, the sequence of data transfers described by the architecture description and by the implementation differ in timing and with respect to the protocol, but are equal with respect to the direction of the requests (whether read or write), the addresses of the requests, and the data written by write requests.

This notion of equivalence must be refined to accommodate interrupts. There must be an interrupt mapping that maps a behaviour (i.e. signal values over time) on the interrupt input signals irpt of the implementation description to a behaviour on the interrupt input signals IRPT of the architecture description.

This mapping must be such that the implementation that receives the behaviour of the interrupt input signals irpt and the architecture that is interrupted by interrupt signals IRPT both produce the same sequence of requests to the data memory. If there is such a mapping, then the implementation description is said to be equivalent to the architecture description. The invention is capable of describing the mapping once the mapping has been shown to exist.

Approach

To verify the equivalence, the approach generates properties that fully describe how a single instruction is executed by the whole pipeline or how an interrupt is executed by the whole pipeline. These generated properties (including a property about reset) will be termed "main properties" below. There might be several main properties for one given instruction or interrupt if the execution is best described using different cases (e.g. conditional jump where the condition is satisfied or not satisfied).

Besides main properties, auxiliary properties and lifeness properties are generated. An aspect of this invention is that the auxiliary properties and the main properties generated by this approach fit together in a well-defined way: Given any legal input trace, it is possible to predict the implementation behaviour based only on the generated main properties and the generated auxiliary properties. This is a general quality criterion. Its advantages and requisite tools have been documented in European Patent Application 05 020 124.3 about the completeness checker. For the purpose of this invention, the dedicated application of completeness checking tools is not necessary, because the properties satisfy this criterion by construction.

The contents of each generated main property include that the generated main property:

- assumes that the processor is in a state from which the processor can start with the execution of an instruction;
- proves the generation of accesses to instruction memory;
- assumes that the fetched instruction and a state of the processor satisfy the conditions about the situation for which the property is made;
- proves that the program counter is correctly updated;
- proves that the processor returns into a state from which it can execute the next instruction;
- proves that the result is computed according to the architecture description and that the signals that control the forwarding are correctly set;
- proves that the program status word is correctly modified;
- proves that the result is correctly written back to the appropriate register file (or register); and
- proves that the implementation correctly determines direction of data bus transfers, its addresses and—in case of write transfers—the write data.

Virtual Registers and Register Files

A further element in the invention is the "Virtual Register" or the "Virtual Register File". This concept serves to verify all issues related to architecture registers such as program status word, register file, or even interrupt configuration registers.

Throughout this description, architecture registers are regarded to be organized in arrays, the register files. If a register is not organized in an array, it will be treated as if it belonged to a register file with only one element. Consequently virtual registers are organized in virtual register files.

A virtual register file is a macro that maps the implementation state to the registers of the architecture state. For an instruction in a stage s the virtual register provides the register file values that the instruction in the stage s observes in the architecture before the instruction in the stage s gets executed. Therefore, the virtual register file is defined depending on the pipeline stages.

The virtual register file is built so that the virtual register file tests the pipeline stages in the order in which the instructions in the pipeline stages appear in the program. Each stage is examined to see whether the stage contains data for the implementation register that is not yet written back. The data found in the first stage is returned. It may be that one of the stages contains an instruction that announces the creation of data as the instruction proceeds further through the pipeline. In this case, the virtual register returns a special value "invalid" that denotes that the respective data is currently not available. If none of the examined stages contains or at least announces data, the data from the corresponding implementation register is returned.

For single pipeline processors, the stages are examined in order of ascending numbers, starting with stage s+1, because there cannot be any other instruction sequence. Therefore, the virtual register file need not be provided by the user. For more elaborate superscalar processors with multiple ones of the pipeline stages and the possibility that one instruction overtakes another one of the instructions executed in another one of the pipelines, the instruction sequence must be deduced from the processor state.

An exemplary process according to this invention is shown in FIG. 1. In a first step 201 the implementation description is read in and transformed into an internal format 202. The implementation description may be given by some hardware description language that, for example, represents RTL. Other implementation descriptions could be net lists or cycle-accurate behavioural descriptions.

The architecture description is read in step 203. The content of the architecture description follow the rules described below. In step 204, the correspondence information 204 is read in. The correspondence information describes design decisions and establishes the correspondence between the implementation description and the architecture description and will be described below. In a property generation step 205 a set of properties 206 is generated from the architecture description, the implementation description 202 and the correspondence information read in previously.

The set of generated properties is then verified against the implementation description in step 207. The verification step 207 can be executed with a formal verification tool, e.g. a model checker or property checker, but the invention also covers any other means to verify properties against an implementation, e.g. simulation. For the formal verification, the verification step 207 may terminate, once a property of the set of generated properties is found that cannot be proven to hold. The steps 204, 205, and 207 demonstrate the equivalence between architecture description and the implementation description.

The result of the verification is displayed in steps 209 in case of equivalence between the architecture description and the implementation description and in step 208 in case of one of the properties failing the proofs that potentially indicates a lack of equivalence between the architecture description and the implementation description. In the latter case, i.e. lack of equivalence, diagnosis information is returned to allow the designer to identify bugs in the implementation description or the architecture description or in the correspondence information.

Usage Models

For formal verification of a previously designed implementation, the method of FIG. 1 will be executed once and the verification step 207 will be implemented by a property checker.

For the formal verification in parallel with the design of the implementation, the process of FIG. 1 will be executed repeatedly with the same correspondence information and an increasing number of instructions described in the architecture description. The number of instructions described in the architecture description entries mirrors the state of the development of the implementation. With this approach, the development of a processor may start with central mechanisms such as forwarding and the generation of stalls, and then stepwise extend the development with support of interrupts and with instructions. The advantage of this example is that every step of the processor design can thus be verified and errors in the processor design can be corrected early in the design cycle of the processor.

For simulation-based verification, the step 207 is implemented by checking the generated properties in a simulation with procedures common to Assertion Based Verification.

Architecture Description

The architecture description represents an automaton with inputs in, outputs out, states AS (composed of a plurality of architecture registers and the program counter), a next state function NSTATE, and an output function OUT.

The automaton starts with a state AS @1 with initialization values, and receives inputs in @1, in @2, in @3, .... The automaton defines a sequence of state values AS @2, AS @3, ... and a sequence of output values out @1, out @2, out @3, ... by out @ i=OUT(AS @ i, in @ i) and AS @ i+1=NSTATE(AS @ i, in @ i). The transitions of the automaton will be referred to as architecture cycles. The j-th architecture cycle is the one that consumes the input in @ j and produces the state AS @ j+1 and the output out @ j.

The architecture description contains the following inputs and outputs, grouped into interfaces:

Instruction Memory Interface

IMEM_ADDRESS: an output providing an instruction address to the instruction memory. It is assumed that under this instruction address, an instruction can be found.

IW: An input providing the instruction word read from the instruction memory for the instruction address IMEM_ADDRESS that was presented in the same memory transaction.

Data Memory Interface

DMEM_ADDRESS: An output providing the data address to the data memory.

DMEM_ACCESS_VALID: A bit output to validate an access to the data memory.

DMEM_RW: A bit output to differentiate between read ('0') and write ('1') accesses to the data memory.

DMEM_WDATA: An output providing the data written to the data memory in that cycle.

DMEM_RDATA: An input providing the data returned from the data memory for the access in the same memory transaction, in case that DMEM_RW is '0'.

The behaviour on this data memory interface is captured in the macros:

```
DMEM_IDLE :=              DMEM_ACCESS_VALID = '0';
DMEM_READ(addr) :=        DMEM_ACCESS_VALID = '1'
                          and
                          DMEM_ACCESS_RW = '0' and
                          DMEM_ADDRESS = addr;
DMEM_WRITE(addr, wdata) := DMEM_ACCESS_VALID = '1'
                          and
                          DMEM_ACCESS_RW = '1' and
                          DMEM_ADDRESS = addr and
                          DMEM_WDATA = wdata;
```

Interrupt Interface

IRPT: An set of input signals related to interrupts, such as e.g. the signal over which interrupts arrive.

Architectural States

The states of the automaton are given by architecture register files (which are arrays of architecture registers that may degenerate to a single architecture register) and the architecture program counter PC. Elements of architecture register files will be referred to as R[k].

Architecture Transitions, i.e. Instructions Interrupts and Initialization

The transactions of the automaton are given by the list of architecture description entries. There is one architecture description entry for initialization, one architecture description entry for interrupt execution, and multiple numbers of architecture description entries to describe instruction execution.

All of the architecture description entries consist of a condition $TRIGGER_m$ and an activity block $ACT_m$. The activity block describes if and how the architecture registers and the program counter are updated if the condition $TRIGGER_m$ is satisfied. The architecture description entry for m=0 describes the interrupt execution, the architecture description entries for m>0 describe the execution of instructions, and the architecture description entry consisting of $ACT_{init}$ and $TRIGGER_{init}$ describe the initialization of the processor.

The architecture description entry for the initialization contains a condition $TRIGGER_{init}$ with a reset behaviour and an activity block of the form $$ACT_{init} = \\ PC = init_{PC} \text{ and} \\ R_1[k_1] = init_{R1,k1} \text{ and} \\ R_2[k_2] = init_{R2,k2} \text{ and} \\ ...$$

The architecture description entry for the initialization provides the initialization values for the architecture state, i.e. AS @1, consisting of the initialization value for the architecture program counter PC @1 and all initialization values for all architecture registers R[k] @1.

The interrupt architecture description entry contains a condition $TRIGGER_0$ that may depend on the architecture registers and the interrupt inputs IRPT of the architecture, but not on PC, IW or DMEM_RDATA. The corresponding activity block $ACT_0$ has the form of a conjunction. This conjunction contains one of the following two register file entries for every register file, and update entry for the PC, and one of the three possible data memory entries, as described in the following. The register file entry for register file R either defines that R gets updated at register address $INDEX_{0,R}$ with value $UPDATE_{0,R}$:

$$ASSIGN_{0,R} := \\ \text{for each k in the index\_range of R} \\ \quad \text{if } k = INDEX_{0,R} \\ \quad \text{then next}(R[k]) = UPDATE_{0,R} \\ \quad \text{else next}(R[k]) = R[k] \\ \text{end for each}$$

where $INDEX_{0,R}$ and $UPDATE_{0,R}$ may depend on the architecture registers, the PC, DMEM_RDATA and on the architecture interrupt inputs IRPT, or it defines that the register file preserves its value $$NO\_ASSIGN_R := \\ \text{for each k in the index\_range of R} \\ \quad \text{next}(R[k]) = R[k] \\ \text{end foreach}$$

The update entry for the PC is of the form $$ASSIGN_{0,PC} := \\ \text{next}(PC) = UPDATE_{0,PC}$$

where $UPDATE_{0,PC}$ may depend on the architecture registers, DMEM_RDATA and on the architecture interrupt inputs IRPT.

The data memory entries are either of the form

| |
|---|
| DMEM_IDLE |
| or |
| DMEM_READ($ADDR_0$) |
| or |
| DMEM_WRITE($ADDR_0$, $WDATA_0$) | with data memory addresses $ADDR_0$ and write data $WDATA_0$ that may depend on the architecture registers, the PC, and on the architecture interrupt inputs IRPT.

DMEM_RDATA may only occur in the activity block $ACT_0$, if DMEM_READ($ADDR_0$) is specified in this activity block.

The instruction entries (m>=1) consist of a condition $TRIGGER_m$ and an activity block $ACT_m$. The condition is of the form

| |
|---|
| $TRIGGER_m$ := |
| not $TRIGGER_0$ and |
| $TRIGGER\_IW_m$ and |
| $TRIGGER\_STATE_m$ |

$TRIGGER\_IW_m$ may only depend on the architecture instruction word IW. $TRIGGER\_STATE_m$ may only depend on the architecture registers, the PC, DMEM_RDATA, and IW.

$TRIGGER\_IW_m$ describes how the opcode of the instruction is decoded from IW. If the description of the instruction execution requires further subdivisions depending on the architecture state, conditions about the architecture state are captured in $TRIGGER\_STATE_m$. Such subdivision is necessary to describe the jump instructions or the instructions that could jump into error correction routines in case the instructions cannot be properly executed.

The activity block is similar to the form described above for the activity block of interrupts, except that all of the macros, and in particular the macros $INDEX_{m,R}$, $UPDATE_{m,R}$, $ADDR_m$, and $WDATA_m$ may depend on all architecture registers, the PC, and IW and must not depend on the architecture interrupt inputs IRPT. $INDEX_{m,R}$ and $UPDATE_{m,R}$ may additionally depend on DMEM_RDATA, if the activity block specifies DMEM_READ($ADDR_m$).

$UPDATE_{m,PC}$ may depend on all architecture registers, the PC, and IW, but not on DMEM_RDATA.

The references to any register file in the $TRIGGER\_STATE_m$, $INDEX_{m,R}$, $UPDATE_{m,R}$, $UPDATE_{m,PC}$, $ADDR_m$ and $WDATA_m$ functions for one architecture specification entry shall be enumerated as follows: The macros $TRIGGER\_STATE_m$, $INDEX_{m,R}$, $UPDATE_{m,R}$, $UPDATE_{m,PC}$, $ADDR_m$ and $WDATA_m$ are decomposed into sub expressions. Some of these sub expressions will be references to an architecture register file, i.e. they are of the form R[<index function>]. These references will be enumerated for every architecture entry m. The index function <index function> will be referred to as $VINDEX_{m,i}$, where i is the number of the enumerated register file accesses.

For example, the function $UPDATE_{m,R}$=R1[IW[3:0]]+R2[IW[7:4]] has two register file accesses, one to R1 and one to R2, with the functions $VINDEX_{m,i}$=IW[3:0] and $VINDEX_{m,i+1}$=IW[7:4].

The architecture description must satisfy a consistency condition of the form that the architecture description is complete for every instruction. This consistency condition requires, that the conditions TRIGGER_STATE about the architecture state of all architecture description entries that belong to the same TRIGGER_IW form a full case split, i.e. disjunction of the conditions TRIGGER_STATE that belong to the same TRIGGER_IW is always satisfied.

Constraint no_reset

A Boolean macro no_reset that describes how the reset is kept inactive must be provided. This Boolean macro will be assumed in all proofs, except for the proof about the reset behaviour.

Access Protocol Description for Instruction and Data Memory

The implemented pipeline is expected to have two memory ports, one port to read instructions and one port to read or write data. The protocol at both ports is described in relation to the pipeline operation. For each one of the port, the number of a pipeline stage has to be provided together with macros that yield direction, address, and—if applicable—write data when the stage does not stall. Moreover, a possibly different stage has to be provided together with macros that yield the read data in case of a read access.

For simple protocols, the requested macros can be defined depending on the processor inputs and the processor outputs that form the instruction or data bus. More complex protocols require bus interface modules between the pipeline and the bus ports. In this case the interface between the pipeline and the bus interface modules will be characterized with the access protocol description. If desired, a verification of the bus interface modules could be executed to show that addresses and data are correctly transferred.

The access protocol description must describe the pipeline stages involved and the signal behaviour. The pipeline stages are provided by a constant. To this end, the pipeline stages are assumed to be numbered consecutively from 1 to n The constant ia denotes the number of the stage at which the instruction address is sent to the instruction bus. It is >=1.

The constant iv is to be chosen >=ia. The constant iv denotes the number of the stage at which the instruction returns from the instruction bus. Often the constant iv is equal to ia+1. In the context of asynchronous memory, the constant iv could take the value of the constant ia.

The constant da describes the number of the stage at which the data memory accesses are started, and at which the address and—if applicable—the write data is provided. As memory accesses cannot be cancelled, it is necessary that the stage da cannot be cancelled neither by interrupts nor by jump instructions.

The constant dv describes the number of the stage at which the read data returns from the data memory. For asynchronous memories, the constant dv may be equal to the constant da, otherwise it will take the value >=da.

For the instruction fetch, a Boolean macro ibus_read(address) must be provided to describe the behaviour of the instruction memory interface signals at the time when the instruction is in the stage ia and is allowed to move to the next stage. This Boolean macro ibus_read(address) may only depend on the interface signals to the instruction memory. A Boolean macro ibus_idle describes the behaviour of these interface signals at any time point, if no read request is to be started. A macro iw specifies the signal or expression that forms the instruction word at the clock cycle, when the instruction is in stage iv and is allowed to move to the next stage.

Whenever the stage iv is allowed to move its instruction forward and at this time point the macro ibus_read(address) is satisfied, the implementation executes a read access on the interface to the instruction memory.

The situation is similar for the data transfers. A Boolean macro dbus_read(address) must be defined describing the behaviour of the data memory interface signals at the time point when the instruction is in the da stage and is allowed to move to the next stage. The write is described by a Boolean macro dbus_write(address, wdata), and the macro dbus_idle describes the inactivity. A macro dbus_rdata specifies the signal or expression that forms the data read in at the time when the instruction is in a stage dv and is allowed to move forward.

Whenever the stage dv of the implementation allows the movement of the instruction forward that the stage dv currently processes and at this point of the macro dbus_read (address) is satisfied, the implementation executes a read data transfer from the given address in the data memory. Whenever the stage dv allows the movement of the current instruction forward and the macro dbus_write(address, wdata) is satisfied, the implementation executes a write data transfer with the given address and the write data wdata. In all other cases, no data transfer is executed. This allows the extraction of the sequence of data transfers of the implementation as required by the definition of equivalence.

External Stall Conditions

The processor may be halted by the environment. Reasons for halting the processor could be wait states of the instruction or data memory. To halt the processor, the processor receives one or multiple halt signals from the environment. The conditions under which these halt signals yield the need to halt the processor must be input into the verification by the definition of the macro external_stall by the designer.

The verification will assume that the external stall condition external_stall will never be active forever.

Correspondence Information

The following describes the correspondence information that the designer must provide in step 204 of FIG. 1. This correspondence information captures implementation decisions and is easily available from the design process. Moreover, this correspondence information is fail safe in the sense that the correspondence information gets checked by the verification. For the formal verification based examples of the invention, this means that unsuitable correspondence information can make the verification falsely fail, but not falsely succeed.

Classification of Pipeline Stages

Let the stages of the pipeline be numbered from 1 to n. The roles of the pipeline stages will be described as follows:

dec is the stage at which the instruction execution really starts. This stage is often the place to which forwarding paths are targeted. Depending on the timing at the instruction bus, the stage dec is often the stage iv or the stage iv+1. In any case the number of the stage dec will be $\geq$=iv.

$jmp_m$: For every architecture description entry m, the stage at which the program counter is set to the value of the next instruction is specified. For simple instructions (like arithmetic instructions), this will be 1; for jumps and interrupts, it will be/=1.

int=$jmp_0$. This describes the stage that decides if an interrupt is accepted. It has the value $jmp_m$<=int for all m. As access to the data bus cannot be cancelled, it is necessary that the number of the stage da>=int.

$vstage_{m,i}$: For m>=1 this provides information to the verification about the stage at which the i-th register file access of architecture specification entry m is made, i.e. the register file access that is related to $VINDEX_{m,i}$. In many cases, all of the forwarding paths target the decode stage of the processor. In this case, the stage $vstage_{m,i}$= dec for all m and i. However, more elaborate processors allow forwarding to later stages than the stage dec. In this case $vstage_{m,i}$ may be set to values>dec. It is necessary that $vstage_{0,i}$=int for all register values read in $TRIGGER_0$, and $vstage_{0,i}$>=int for all registers referenced in $ACT_0$, the activity block that describes interrupt execution.

$writeback_R$: For every architecture register file R, a write back stage must be provided in the sense of the virtual register file above. This example of the invention requires int<=$writeback_R$ for all register files R.

Stall Conditions

For every stage s in [1, n], the condition under which this stage s stalls must be provided in a macro $stall_s$. This macro stall may depend on all implementation signals.

If the macro takes the value 1, the stage s stalls which means that the stage s continues processing the current instruction additionally in the next implementation clock cycle. If the macro takes the value 0, the stage s does not stall (sometimes being referred to by "the stage has a nostall"). This means that the stage s passes the current instruction to the next stage (or drops the current instruction, if the stage s is the last stage n in the pipeline).

Cancel Conditions

For every stage s in [1, n], the condition under which the stage s is cancelled must be provided in a macro $cancel_s$. This macro $cancel_s$ may depend on all of the implementation signals.

If the macro takes the value 1, the stage s is cancelled, which means that the instruction is removed from the stage s and the ensuing operation of the implementation pretends that the instruction was never available.

It is necessary that if a stage s is cancelled, all stages 1, ... s−1 are also cancelled.

In the following, the abbreviation primary_$cancel_s$=not $cancel_{s+1}$ and $cancel_s$ will be used for s in [1, n−1].

Full

For every stage s in [2, n] a macro full, must be provided that takes the value 1 when the stage s currently executes an instruction or an interrupt and 0 otherwise. The macro full may depend on all implementation signals.

Start State

A Boolean macro process_new_instruction_state that describes states in which the processor implementation starts the new instructions is provided.

Program Counter

A macro pc must be provided that maps the implementation states to the value of the implementation program counter pc. This macro pc will typically be defined to be equal to some implementation signal that stores the implementation program counter.

Virtual Register File

The following information is to be provided for all of the architecture register files R:

An implementation register file $current_R(k)$, at which k is the index to the architecture register file.

A stage $writeback_R$ that provides the stage from which the value will be written into the implementation register file $current_R$.

For every stage s between (and including) dec+1 and the stage $writeback_R$

A Boolean macro $result\_write_{R,s}$ that is true if the instruction in stage s will create new data. This macro $result\_write_{R,s}$ returns false when the stage s is empty.

A macro $result\_dest_{R,s}$: If the macro $result\_write_{R,s}$ is true, this macro $result\_dest_{R,s}$ contains the register file address to which the instruction in the stage s write.

A Boolean macro result_valid$_{R,s}$ that is true if the instruction in stage s has already produced new data, which is now shifted through the pipeline. This macro result_valid$_{R,s}$ is false when the stage s is empty.

A macro result_data$_{R,s}$ that yields the result for R of the instruction that is currently in stage s, if the macro result_valid$_{R,s}$ is true.

From these macros the verification process creates the virtual register functions as follows: The k-th element of the virtual register file for architectural register file R for an instruction in stage s is given by $$\text{data}_{R,writebackR}(k) \ @ \ t = \text{current}_R(k) \ @ \ t$$
and
$$\text{data}_{R,s}(k) \ @ \ t = $$
$$\quad (\text{if result\_write}_{R,s+1} \text{ and result\_dest}_{R,s+1} = k$$
$$\quad \text{then result\_data}_{R,s+1}$$
$$\quad \text{else data}_{R,s+1}(k)) \ @ \ t$$
for the stages s in [dec, writeback$_R$ − 1].

The rationale behind this definition is that the stages are checked in increasing order. If a value is still to be written into the implementation register file, this value will nonetheless be the value of the corresponding architecture state. Thus, this function takes part in the verification of forwarding.

However, virtual registers may be invalid. This is the case when some of the instructions requires multiple stages to compute a result according to the architecture description. Then it may be that one instruction already requests the value while the current instruction is still in a stage that did not produce this requested value. In this case, the virtual register returns a special invalidity value. A separate macro is used to flag such situations. The separate macro is $$\text{valid}_{R,writebackR}(k) \ @ \ t = \text{true}$$
$$\text{valid}_{R,s}(k) \ @ \ t = $$
$$\quad (\text{if } (\text{result\_write}_{R,s+1} \text{ and result\_dest}_{R,s+1} = k)$$
$$\quad \text{then result\_valid}_{R,s+1}$$
$$\quad \text{else valid}_{R,s+1}(k)) \ @ \ t \quad \text{for the stages s in [dec, writeback}_R - 1]$$
and
$$\text{valid}_{R,s}(k) \ @ \ t = \text{false for the stages s in [1, dec−1]}.$$

Property Generation

The following is a description of the property generation step 205 of FIG. 1 in which properties are generated. To this end, property schemata are provided. A property schemata is a description of how a property is to be generated. To this end, the property schemata includes meta commands to replicate certain parts of a text of the property or to write other parts of the property text only if a particular condition is satisfied. Moreover, a property schemata provides placeholders for the constants and macros that constitute the access protocol description and the correspondence information.

The property generation step 205 can be executed if a specific architecture description and a specific implementation description exists. The property generation step 205 is accompanied with a related correspondence information and a related access protocol description. Then the property generation step comprises:
1. Executing all of the meta commands, i.e. replicate or omit parts of the property text as prescribed by the meta commands.
2. Instantiating the placeholders with macros of the same name. These macros are provided by the correspondence information, the access protocol description, or the macros are derived from the architecture description in a way that is related to the property schemata.
3. replacing all of the placeholders for the numbers of pipeline stages, e.g. ia, iv, da, dv, int, jmp$_m$, that occur in the property text or the macro text, by the actual numbers provided in the access protocol description or the correspondence information.

This provides the generated properties that are to be proven to demonstrate equivalence.

Property Schemata for a Simple Instruction

For every architecture description entry m>0 with jmp$_m$=1, a property is generated according to the property schemata simple_instruction which will be discussed in this section.

The property schemata simple_instruction introduces time points $t_1, t_2, t_3, \ldots$ that describe the time points when the pipeline stages that currently execute the current instruction do not stall and allow the current instruction to move forward.

An example for an instruction that is handled in this section is an add instruction, for which the architecture description describes that the add instruction sums up the contents of two architecture registers from the architecture register file and writes the result back into the architecture register file To describe the related property, macros trigger$_0$, trigger_iw$_m$, trigger_state$_m$, update$_{m,R}$, index$_{m,R}$, update$_{m,PC}$, vindex$_{m,i}$, addr$_m$ and wdata$_m$ depending on the implementation state are derived from the architecture description macros TRIGGER$_0$, TRIGGER_IW$_m$, TRIGGER_STATE$_m$, UPDATE$_{m,R}$, INDEX$_{m,R}$, UPDATE$_{m,PC}$, VINDEX$_{m,i}$, ADDR$_m$ and WDATA$_m$.

The macro triggers is derived from the macro TRIGGER$_0$, as follows: The expression of the macro TRIGGER$_0$ is syntactically decomposed until sub expressions are reached that either reference architecture interrupt inputs from the signal IRPT or one of the enumerated architecture register file accesses of the form R[VINDEX$_{0,i}$], or constants. According to the definition of TRIGGER$_0$, these are all possible sub expressions. If the sub expression is a constant, the sub expression is not replaced. If the sub expression is R[VINDEX$_{0,i}$], it is replaced by the expression data$_{R,int}$(vindex$_{0,i}$), consisting of the virtual register function data$_{R,int}$ and an address function vindex$_{0,i}$ that is generated recursively from VINDEX$_{0,i}$ in the way how triggers is generated from TRIGGER$_0$. Every reference to an architecture interrupt input is replaced by the corresponding reference to a corresponding implementation interrupt input. The set of all architecture interrupt signals IRPT is replaced by the set of all implementation interrupt signals irpt. The expression with the replaced sub expressions then forms the property macro tigger$_0$.

The other macros trigger_iw$_m$, trigger_state$_m$, update$_{m,R}$, index$_{m,R}$, update$_{m,PC}$, vindex$_{m,i}$, addr$_m$ and wdata$_m$ are derived from the macros TRIGGER_IW$_m$, TRIGGER_STATE$_m$, UPDATE$_{m,R}$, INDEX$_{m,R}$, UPDATE$_{m,PC}$, VINDEX$_{m,i}$, ADDR$_m$ and WDATA$_m$ as follows: The expressions are again syntactically decomposed, until sub expressions are obtained, that are either constants, IW, PC, DMEM_RDATA, or references to architecture register files of the form R[VINDEX$_{m,i}$]. If the subexpression is a constant, it will not be replaced. If the subexpression is IW, it will be replaced by iw @ $t_{iv}$, and iv will be replaced by the number of the pipeline stage according to the access protocol description. If it occurs, the subexpression DMEM_RDATA is replaced by dbus_rdata @ $t_{dv}$, and dv will be replaced by the number of the pipeline stage according to the access protocol description. PC is replaced by pc @ $t_0+1$. R[VINDEX$_{m,i}$] is replaced by the virtual register file function data$_{R,vstage(m,i)}$(vindex$_{m,i}$) @ $t_{vstage(m,i)}$ (to keep the expression legible, vstage(m,i) is written instead of vstage$_{m,i}$), where vstage$_{m,i}$ is specified in the correspondence information. The expression $VINDEX_{m,i}$ is processed recursively in the same way to create $vindex_{m,i}$. The expression with the replaced sub expressions then forms the derived macro.

The following example illustrates a property schemata, i.e. the example provides a description of how, given the above replacements and the above correspondence information, the property is to be generated. Meta commands are provided to specify repeated or conditional creation of property code. Such meta commands are preceded by #, whereas explaining text will be preceded by //. Regular repetitions are also denoted with " . . . ". The lines of the property schemata are numbered to ease reference.

The graphical impression of this property is given in FIG. 2 and shows how the instruction moves down the pipeline according to the stall signals.

The entry "dependencies: no_reset" highlights the fact that this property is to be proven under the additional assumption that the reset is kept inactive. Line numbers are introduced to allow reference of parts of the property schemata.

The related property schemata reads

```
          property simple_instruction;
          dependencies: no_reset;
          for time_points:
 5            t0 = t,
              t1 > t0,
              t2 > t1,
              ...
              tn > tn−1;
10        assume:
          // The time points where the instruction moves forward
          at   t0:               stall1 = 0 || cancel1 = 1;
          during [t0+1, t1−1]:   stall1 = 1;
15        at   t1:               stall1 = 0;
          during [t1+1, t2−1]:   stall2 = 1;
          at   t2:               stall2 = 0;
          during [t2+1, t3−1]:   stall3 = 1;
          at   t3:               stall3 = 0;
20        ...
          at   tn:               stalln = 0;
          // assume that no preceding property cancelled this one
          during [t0+1, t1]:     cancel1 = 0;
          during [t1+1, t2]:     cancel2 = 0;
25        during [t2+1, t3]:     cancel3 = 0;
          ...
          during [tn−1+1, tn]:   canceln = 0;
30        // assume that the processor is ready to execute next instruction
          at   t0:               process_new_instruction_state;
          // assume that instruction execution is not interrupted.
          during [t0+1, tint]:   not trigger0;
35
          <fetch> // This is a cut point, see ITL section
          // Assume that iw contains the instruction
          // that should be handled in this property.
40        at   tiv:              trigger_iwm;
          <validate_regs>
          at   tdec:             trigger_statem;
45
          prove:
          at   tia:              ibus_read(pc @ t0+1);
          <fetch>
50
          // Prove that the virtual register file values are valid
          // whenever they are to decide upon trigger_state.
          # for each reference z to an architecture register file in
              # TRIGGER_STATEm:
55            at tvstage(m,z):   validR,vstage(m,z)(vindexm,z);
          # end for each;
          <validate_regs>
60        // Prove that the virtual register file values are valid
          // whenever they are required.
          # for each reference z to an architecture register file in
              # UPDATEm,R, INDEXm,R, ADDRm, or WDATAm:
              at tvstage(m,z):   validR,vstage(m,z)(vindexm,z);
```

```
65        # end for each;
          at   t1:               process_new_instruction_state;
          at   t1+1:             pc = updatem,PC;
70        // Prove that the full signals are correctly created.
          during [t1+1, t2]:     full2 = 1;
          during [t2+1, t3]:     full3 = 1;
          ...
          during [tn−1+1, tn]:   fulln = 1;
75
          // Prove that this instruction will not initiate cancels.
          during [t1+1, t2]:     primary_cancel1 = 0;
          during [t2+1, t3]:     primary_cancel2 = 0;
          ...
80        during [tn−1+1, tn]:   primary_canceln−1 = 0;
          // For all registers that get updated, prove their correct
          // handling in the pipeline.
85        # for each register file R with ASSIGNm,R in the architecture
              # description entry:
              # for each stage s = dec + 1, dec + 2, ... writebackR−1
                  at ts:         if result_validR,s = 1
                                    then next(result_validR,s+1) = 1
90                                end if;
              # end for each stage
              # for each stage s = dec + 1, dec + 2, ... writebackR
                  during [ts−1+1, ts]:   result_writeR,s = 1;
                  during [ts−1+1, ts]:   result_destR,s = indexm,R;
95                during [ts−1+1, ts−1]: if (result_validR,s = 1)
                                            then next(result_validR,s) = 1
                                          end if;
                  during [ts−1+1, ts]:   if (result_validR,s = 1)
                                            then result_dataR,s = updatem,R;
100                                       end if;
              # end for each stage
              at twritebackR+1:   currentR(indexm,R) = updatem,R
          # end for each register
          # for each register file R with NO_ASSIGNR in the arch. entry:
105           # for each stage s = dec + 1, dec + 2, ... writebackR
                  during [ts−1+1, ts]:   result_writeR,s = 0;
              # end for each stage
          # end for each register
          # if the architecture description entry contains
          DMEM_READ(ADDRm)
110           at  tda:           dbus_read(addrm);
          # else if it contains DMEM_WRITE(ADDRm, WDATAm)
              at  tda:           dbus_write(addrm, wdatam);
          # else // it contains DMEM_IDLE
              at  tda:           dbus_idle;
115       # end if;
          left_hook:    t0;
          right_hook:   t1;
          end property;
```

Lines 5 to 9 introduce the time variables $t_0$, $t_1$, $t_2$ until $t_n$. The lines 12 to 21 relate these time variables $t_0$, $t_1$, $t_2$ until $t_n$ to the points of time when the instruction execution is allowed to move forward. This is done for every stage. The stalls conditions and the $cancel_0$ condition are provided in the correspondence information.

The lines 24 to 28 require that no stage is cancelled while the stage executes the instruction. Again, the requirement is specified for every one of the stages. The $cancel_i$ entries are from the correspondence information.

Line 31 is to be filled with the correspondence information. It focuses the examination on the states of controllers that allow the instruction to be started.

Line 34 requires that no interrupt is accepted. $trigger_0$ is to be derived according to the description above.

The cut point fetch in line 36 together with its sole proof part in line 47 ensures that the reading of the instruction bus is independent from the actual instruction that is being read.

This instruction is decoded by $trigger\_iw_m$ in the line 40. $trigger\_iw_m$ is defined in the section above. The decoding is related to the time point where the stage does not stall, in which the instruction arrives from the instruction memory.

This again introduces a cut point validate_regs, and the related property proves the lines 46 to 56 of the property schemata. These lines ensure that the virtual register file values that are evaluated by the condition trigger_state$_m$ are valid independently from this decision. If trigger_state$_m$ is trivially true, there is nothing more to prove than with the preceding property generated from cut point fetch, because then lines 54 to 55 specify that no entry will be made.

Line 62 to 65 of the proof part requires that the virtual register file used to compute the result of the instruction must be valid from the first stage onwards where the pipelined execution of the instruction needs them.

Lines 67 ensure that the instruction evaluation returns to the state where the next instruction can be started. Line 68 ensures that this next instruction will be fetched from the right address.

Lines 71 to 74 range across all stages and prove that the related full$_s$ macros from the correspondence information yield 1 to show that the instruction is executed.

Lines 77 to 80 range across all stages and prove that this instruction will never issue a cancel to the previous stages.

Lines 85 to 103 ensure that a virtual register file of every register file that is assigned a value according to the architecture description really receives the right value and correctly propagates it through the pipeline. The corresponding functions are correspondence information.

Line 105 to 107 ensures that a register file that does not get updated will be correctly handled.

Lines 85 to 107 range across all possible register files.

Lines 109 to 115 ensure the right communication with the memory.

Jump Instructions

For every architecture description entry m>0 with jmp$_m$/=1 a property is generated according to the property schemata jump_instruction.

Jump instructions etc. will often lead to two parts of the architecture description. One part of the architecture description describes the behaviour if the condition is satisfied and the jump is taken, the other part of the architecture description describes the behaviour if the condition is not satisfied and the jump is not taken. If the jump is not taken, the program counter PC will be updated in the usual way, i.e. by the number of the bytes that the instruction occupies in the instruction memory.

If the jump is taken, the program counter pc will be updated differently. This update of the program counter must wait until the jump instruction is in the pipeline stage jmp$_m$ at which the jump instruction decides whether to take the jump or not. If the jump instruction decides to take the jump, there may be wrongly speculated instructions in the pipeline stages <jmp$_m$ which must be removed by cancelling the wrongly speculated instructions in the pipeline stages <jmp$_m$.

Besides the non default update to the program counter pc, the architecture description may specify that the jump instruction updates architecture registers and execute memory traffic in the form described above for simple instructions. Therefore, large parts of the property schemata for the instructions simple_instructions will also occur in the property schemata for the instructions jump instructions.

The macros trigger$_0$, trigger_iw$_m$, trigger_state$_m$, update$_{m,R}$, index$_{m,R}$, update$_{m,PC}$, vindex$_{m,i}$, addr$_m$ and wdata$_m$ are derived as described for the property schemata simple_instructions.

FIG. 3 shows the timing relation of the jump instruction. The timing relation is shown when the pipeline stages execute the jump instruction. The figure will also show when the pipeline stages are cancelled to remove instructions the execution of which was speculatively started by the processor.

To simplify reading, jmp is written in the indices instead of jmp$_m$.

```
1  property jump_instruction;
   dependencies: no_reset;
   for time_points:
5      t_0 = t,
       t_1 > t_0,
       t_2 > t_1,
       ...
       t_n > t_{n-1};
10
   assume:
   // The time points where the instruction moves forward
       at    t_0:                 stall_1 = 0 || cancel_1 = 1;
       during [t_0+1, t_1-1]:     stall_1 = 1;
15     at    t_1:                 stall_1 = 0;
       during [t_1+1, t_2-1]:     stall_2 = 1;
       at    t_2:                 stall_2 = 0;
       during [t_2+1, t_3-1]:     stall_3 = 1;
       at    t_3:                 stall_3 = 0;
20     ...
       at    t_n:                 stall_n = 0;
   // assume that no preceding property cancelled this one
       during [t_0+1, t_1]:       cancel_1 = 0;
25     during [t_1+1, t_2]:       cancel_2 = 0;
       during [t_2+1, t_3]:       cancel_3 = 0;
       ...
       during [t_{n-1}+1, t_n]:   cancel_n = 0;
30 // assume that the processor is ready to execute next instruction
       at    t_0:                 process_new_instruction_state;
   // assume that instruction execution is not interrupted.
       during [t_0+1, t_int]:     not trigger_0;
35
   <fetch> // This is a cut point, see ITL section
   // Assume that iw (the freeze variable) contains the instruction
   // that should be handled in this property.
40     at    t_iv:                trigger_iw_m;
   <validate_regs>
       at    t_dec:               trigger_state_m;
45
   prove:
       at    t_ia:                ibus_read(pc @ t_0+1);
   <fetch>
50
   // Prove that the virtual register file values are valid
   // whenever they are to decide upon trigger_state.
   # for each reference z to an architecture register file
   # in TRIGGER_STATE_m:
55     at t_{vstage(m,z)}:        valid_{R,vstage(m,z)}(vindex_{m,z});
   # end for each;
   <validate_regs>
60 // Prove that the virtual register file values are valid
   // whenever they are required.
   # for each reference z to an architecture register file
       # in UPDATE_{m,R}, INDEX_{m,R}, ADDR_m, or WDATA_m:
       at t_{vstage(m,z)}:        valid_{R,vstage(m,z)}(vindex_{m,z});
65 # end for each;
       at t_1:                    process_new_instruction_state;
       at t_{jmp}+1:              pc = update_{m,PC};
70 // Prove that the full signals are correctly created.
       during [t_1+1, t_2]:       full_2 = 1;
       during [t_2+1, t_3]:       full_3 = 1;
       ...
       during [t_{n-1}+1, t_n]:   full_n = 1;
75
   // Prove that wrongly fetched instructions are cancelled.
       at   t_{jmp}:              primary_cancel_{jmp-1} = 1;
   // Prove that the cancel creates empty stages
80     at   t_{jmp} + 1:          full_2 = 0;
       at   t_{jmp} + 1:          full_3 = 0;
       ...
       at   t_{jmp} + 1:          full_{jmp} = 0;
```

-continued

```
85   .
       // Prove that this instruction will not initiate further cancels.
       during [t_jmp+1, t_jmp+1]:    primary_cancel_jmp = 0;
       during [t_jmp+1+1, t_jmp+2]:  primary_cancel_jmp+1 = 0;
       during [t_jmp+2+1, t_jmp+3]:  primary_cancel_jmp+2 = 0;
90   ...
       during [t_n-1+1, t_n]:        primary_cancel_n-1 = 0;
       // For all registers that get updated, prove their correct
95   // handling in the pipeline.
       # for each register file R with ASSIGN_m,R in the architecture
           # description entry:
           # for each stage s = dec + 1, dec + 2, ... writeback_R-1
               at  t_s:              if result_valid_R,s = 1
100                                  then next(result_valid_R,s+1) = 1
                                     end if;
           # end for each stage
           # for each stage s = dec + 1, dec + 2, ... writeback_R
               during [t_s-1+1, t_s]:   result_write_R,s = 1;
105            during [t_s-1+1, t_s]:   result_dest_R,s = index_m,R;
               during [t_s-1+1, t_s-1]: if (result_valid_R,s = 1)
                                          then next(result_valid_R,s) = 1
                                          end if;
               during [t_s-1+1, t_s]:   if (result_valid_R,s = 1)
110                                     then result_data_R,s = update_m,R;
                                        end if;
           # end for each stage
           at t_writeback,R+1:          current_R(index_R) = update_m,R;
           # end for each register
115    # for each register file R with NO_ASSIGN_R in the
       architecture entry:
           # for each stage s = dec + 1, dec + 2, ... writeback_R
               during [t_s-1+1, t_s]:   result_write_R,s = 0;
           # end for each stage
           # end for each register
120    # if the architecture description entry contains
       DMEM_READ(ADDR_m)
           at t_da:              dbus_read(addr_m);
       # else if it contains DMEM_WRITE(ADDR_m, WDATA_m)
           at t_da:              dbus_write(addr_m, wdata_m);
       # else // it contains DMEM_IDLE
125        at t_da:              dbus_idle;
       # end if
       left_hook:      t_0;
       right_hook:     t_jmp;
130  end property;
```

Lines 1 to 71 are equal to the property schemata simple_instruction and are explained there.

Line 77 proves that all stages with numbers below the one that currently executes the jump instruction are cancelled. This follows from the definition of primary_cancel given in the section about the cancel macros in the correspondence information.

The lines 80 to 83 range across the stage 1 to the stage $jmp_m$ and prove that the cancelled stages are indeed empty.

Lines 87 to 91 range across the stages $jmp_m$ to n−1 and ensure that this jump instruction will not issue any further cancel.

The lines 94 to 130 in this property schemata equal the lines 84 to 120 in the preceding property schemata and are explained there.

Interrupts

For the architecture description entry 0 about interrupts, several properties are to be generated according to the property schemata interrupts. This is described by an additional variable h, that takes the values h=1, 2, . . . .

An interrupt arrives from outside the processor. In the simplified view of the architecture description, the interrupt arrives simultaneously with some instruction Inst. Whether or not the interrupt is accepted by the processor is decided by the macro $TRIGGER_0$ (introduced previously) using status of the architecture at a time point before the instruction Inst is executed. The status of the architecture may, for example, indicate whether the interrupt is to be masked (i.e. not observed).

The mapping to the implementation description is not straightforward. The pipeline acts on multiple ones of the instructions simultaneously. A determination needs to be carried out which ones of the instructions will be regarded as being the instruction that is to be replaced by the execution of the interrupt. The approach is to define a stage int at which the interrupt is accepted. This stage int is typically the last from which any of the jump instruction can cancel other stages. Therefore, it is necessary that the value of $jmp_m <=$int for all $jmp_m$.

If the stage int is full when the interrupt is accepted by the processor, the instruction in this stage int will be replaced. If the stage int is empty, the instruction in the non-empty stage with the highest number<int will be replaced. This highest number of the non-empty stages will be denoted with h below. Note that stage 1 is regarded as being always full (i.e. non-empty).

The macro triggers is derived from $TRIGGER_0$ in the way described for property schemata simple_instruction. The time point when the macro triggers accepts an interrupt will be denoted $t_{irpt}$. After this time point, the pipeline executes the interrupt in the pipeline stages int, int+1 etc. $t_{int}, t_{int+1}, \ldots$ denote the time points when the interrupt execution is in the respective one of the stages int, int+1, . . . and is allowed to move forward by the stall signals. In many cases $t_{irpt}$ will be $t_{int}$, but this is not required. Before $t_{irpt}$, the time points $t_1$, $t_2, \ldots t_{h-1}$ reflect the time points where the instruction that is in stage h at time $t_{irpt}$ is allowed to move forward by the stall signal of the respective stage. Moreover, for the ensuing proof, the time points $t_h, t_{h+1}, \ldots t_{int-1}$ are defined to be $t_{irpt}$.

The macros $update_{0,R}$, $index_{0,R}$, $update_{0,PC}$, $vindex_{0,z}$, $addr_0$, and $wdata_0$ are again derived from the architecture description macros as follows:

$UPDATE_{0,R}$, $INDEX_{0,R}$, $UPDATE_{0,PC}$, $VINDEX_{0,z}$, $ADDR_0$, and $WDATA_0$ are decomposed into sub expressions. By definition, these sub expressions are constants, register file accesses of the form $R[VINDEX_{0,z}]$, PC, DMEM_RDATA, or the architecture interrupt inputs IRPT. To obtain the derived macros, these sub-expressions are replaced as follows:

constants are not changed $R[VINDEX_{0,z}]$ is replaced by $data_{R,vstage(0,z)}(vindex_{0,z})$ @ $t_{vstage(0,z)}$, where $vindex_{0,z}$ is generated from $VINDEX_{0,z}$ by recursively applying the procedure described here (Note that $vstage_{0,z}$ is required to be >=int).

PC is replaced by pc @ $t_0+1$ (Note that this is always the program counter PC of the oldest instruction that gets removed by the interrupt).

DMEM_RDATA is replaced by dbus_rdata @ $t_{dv}$.

An architecture interrupt signal from IRPT is replaced by the corresponding signal in irpt @ $t_{irpt}$.

The expression with the replaced sub expressions then forms the derived macro.

The timing structure of a possible generated interrupt property is represented in FIG. 4. It shows that the interrupt need not occur together with a stall.

There is one property schemata for every value that h can take, i.e. h=1 . . . int.

```
1    property interrupt_h;
     dependencies: no_reset;
     for time_points:
5       t_0 = t,
        t_1 > t_0,
        t_2 > t_1,
        ...
        t_{h-1} > t_{h-2},
```

-continued

```
10
        t_irpt > t_{h-1},
        t_h = t_irpt,
        t_{h+1} = t_irpt,
15      ..,
        t_{int-1} = t_irpt,
        t_int >= t_irpt,
20      t_{int+1} > t_int,
        ...
        t_n > t_{n-1};
    assume:
25  at    t_0:                     stall_1 = 0 || cancel_1 = 1;
    during [t_0+1, t_1-1]:         stall_1 = 1;
    at    t_1:                     stall_1 = 0;
    during [t_1+1, t_2-1]:         stall_2 = 1;
    at    t_2:                     Stall_2 = 0;
30  during [t_2+1, t_3-1]:         stall_3 = 1;
    at    t_3:                     stall_3 = 0;
    ...
    during [t_{h-2}+1, t_{h-1}-1]: stall_{h-1} = 1;
    at    t_{h-1}:                 stall_{h-1} = 0;
35
    during [t_{h-1}+1, t_irpt-1]:  stall_h = 1 and not trigger_0;
    at    t_irpt:                  trigger_0;
    during [t_irpt, t_int-1]:      stall_int = 1;
    at    t_int:                   stall_int = 0;
40  during [t_int+1, t_{int+1}-1]: stall_{int+1} = 1;
    at    t_{int+1}:               stall_{int+1} = 0;
    during [t_{int+1}+1, t_{int+2}-1]:stall_{int+2} = 1;
    at    t_{int+2}:               stall_{int+2} = 0;
    ...
45  during [t_{n-1}+1, t_n-1]:     stall_n = 1;
    at    t_n:                     stall_n = 0;
    during [t_0+1, t_1]:           cancel_1 = 0;
    during [t_1+1, t_2]:           cancel_2 = 0;
50  during [t_2+1, t_3]:           cancel_3 = 0;
    ...
    during [t_{h-1}+1, t_irpt-1]:  cancel_h = 0;
    during [t_irpt+1, t_int]:      cancel_int = 0;
    during [t_int+1, t_{int+1}]:   cancel_{int+1} = 0;
55  ...
    during [t_{n-1}+1, t_n]:       cancel_n = 0;
    // assume that the processor is ready to execute next instruction
    at    t_0:                     process_new_instruction_state;
60
    // Focus h on the highest nonempty stage.
    at    t_irpt:                  full_{h+1} = 0;
    at    t_irpt:                  full_{h+2} = 0;
    ...
65  at    t_irpt:                  full_int = 0;
    prove:
    at    t_int:                   process_new_instruction_state;
70  // New PC from interrupt
    at    t_int+1:                 pc = update_{0,PC};
    // Prove that the full signals are correctly created.
    during [t_1+1, t_2]:           full_2 = 1;
75  during [t_2+1, t_3]:           full_3 = 1;
    ...
    during [t_{h-1}+1, t_irpt-1]:  full_h = 1;
    during [t_irpt+1, t_int]:      full_int = 1;
80  during [t_int+1, t_{int+1}]:   full_{int+1} = 1;
    during [t_{int+1}+1, t_{int+2}]: full_{int+2} = 1;
    ...
    during [t_{n-1}+1, t_n]:       full_n = 1;
85  // Prove that all instructions in the pipeline get removed
    at    t_irpt:                  primary_cancel_{int-1} = 1;
    at    t_irpt+1:                full_2 = 0;
    at    t_irpt+1:                full_3 = 0;
90  ...
    at    t_irpt+1:                full_{int-1} = 0;
    at    t_irpt+1:                if prev(stall_int) = 0
                                   then full_int = 0
95                                 end if;
    // Prove that the virtual register file values are valid
    // whenever they are required.
    // In the index subscripts vstage_{R,k} will be written vstage(R,k).
100 # for each reference to an architecture register file in
      # UPDATE_{0,R}, INDEX_{0,R}, ADDR_0, or WDATA_0:
        at t_{vstage(0,z)}:        valid_{R,vstage(0,z)}(vindex_{0,z});
    # end for each;

105 // Prove that there will not be a second interrupt.
    during [t_irpt+1, t_int]:      trigger_0 = 0;
    // For all registers that get updated, prove their correct
    // handling in the pipeline.
110 # for each register file R with ASSIGN_{0,R} in the architecture entry:
        at    t_int:               if (t_irpt != t_int and result_valid_{R,int} = 1)
                                   then next(result_valid_{R,int+1}) = 1
                                   end if;
115     # for each stage s = int+1, int+2, ... writeback_R-1
            at    t_s:             if result_valid_{R,s} = 1
                                   then next(result_valid_{R,s+1}) = 1
                                   end if;
        # end for each stage
120
        during [t_irpt+1, t_int-1]: if (result_valid_{R,int} = 1)
                                    then next(result_valid_{R,int}) = 1
                                    end if;
        during [t_irpt+1, t_int]:   result_write_{R,int} = 1;
125     during [t_irpt+1, t_int]:   result_dest_{R,int} = index_{0,R};
        # for each stage s = int + 1, int + 2, ... writeback_R
            during [t_{s-1}+1, t_s]: result_write_{R,s} = 1;
            during [t_{s-1}+1, t_s]: result_dest_{R,s} = index_{0,R};
130         during [t_{s-1}+1, t_s-1]: if (result_valid_{R,s} = 1)
                                       then next(result_valid_{R,s}) = 1
                                       end if;
            during [t_{s-1}+1, t_s]: if (result_valid_{R,s} = 1)
                                     then result_data_{R,s} = update_{0,R};
135                                  end if;
        # end for each stage
        at t_{writebackR}+1:        current_R(index_{0,R}) = update_{0,R};
    # end for each register
140 # for each register file R with NO_ASSIGN_R in the spec entry:
        # for each stage s = dec + 1, dec + 2, ... writeback_R
            during [t_{s-1}+1, t_s]: result_write_{R,s} = 0;
        # end for each stage
    # end for each register
145 # if the interrupt description contains DMEM_READ(ADDR_0)
        at t_da:                   dbus_read(addr_0);
    # else the interrupt description contains
        # DMEM_WRITE(ADDR_0, WDATA_0)
        at t_da:                   dbus_write(addr_0, wdata_0);
150 # else // no transaction to the data memory
        at t_da:                   dbus_idle;
    # end if
    left_hook: t0;
155 right hook: t_int;
    end property;
```

The generated property describes how an instruction begins executing but is then replaced by the execution of an interrupt.

Lines 6 to 9 range across the stages 1 to h−1 and introduce the time variables for the time points when the instruction that is later replaced is allowed to move forward in the pipeline. If h=1, these lines specify no entry.

Line 11 introduces the time variable $t_{irpt}$ at which the interrupt is accepted. Lines 13 to 16 range across all stages from h to int−1 and introduce the related time variables $t_s$. If h=int, these lines 13 to 16 specify no entry.

Line 17 specifies the time variable $t_{int}$ at which the interrupt execution moves forward into the next pipeline stage. This time variable is allowed to coincide with $t_{irpt}$.

Note that all time points of the form t plus some index except $t_{irpt}$ refer to one of the time points $t_0, t_1, \ldots t_n$ by evaluation of the index according to the constants introduced in the access protocol description and the correspondence information. But $t_{irpt}$ is a separate time point that need not be equal to any of the other time points.

The lines 20 to 22 range over all stages between int+1 and n and introduce the points of time when the interrupt execution is shifted to the next stage.

Correspondingly, the lines 25 to 46 instantiate the time variables with the appropriate time points according to the signal behaviour: The lines 26 to 34 range across the stages 1 to h−1 and degenerate to no entry, if h=1, lines 36 and 37 introduce $t_{irpt}$ as being the point of time of the interrupt that is accepted when the instruction to be replaced is in stage h. Lines 38 and 39 describe how the interrupt execution waits in stage int until it is shifted forward. Lines 40 to 46 range over the stages int+1 to n and describe how the interrupt execution is shifted forward.

Line 69 assumes that the generated property starts in a state from which a new instruction can be executed.

Lines 62 to 65 range across the stages h+1 to int and may degenerate to no entry, if h=int. It ensures that the instruction in stage h is indeed the highest one. The $full_s$ macros are specified in the correspondence information.

In the proof part, it will be shown in Line 69 that the circuit returns to the state from where new instructions are to be executed.

Lines 74 to 77 range over the stages 2 to h and degenerate to no entry, if h=1. They show how the pipeline stages are filled by the instruction that is later replaced by the interrupt execution. The $full_s$ macros come from the correspondence information.

The lines 79 to 83 describe how the stages are filled by the execution of the interrupt.

Line 86 shows how all stages below the stage int are cancelled. Lines 88 to 93 range over all of the stages 2 to int−1 and prove that the cancel instruction indeed emptied this stage. Line 93 extends the effect of the cancel instruction to stage int, if the interrupt is accepted when the stall macro of stage int is 0.

The values of the virtual registers referenced in the macro $trigger_0$ need to be valid always. This is proven by a separate property according to property schemata interrupt_regs_ $valid_{R,k}$ below. Therefore, it is sufficient to require that the values in the other architecture description macros are valid in the stage where they are needed. This is done in the lines 100 to 103.

Line 106 requires that there is some mechanism that prevents the acceptance of another interrupt before the current one shifts to the next stage int+1.

Lines 108 to 156 deal with the impact of interrupt execution on the register files and data bus transfers in a manner similar to that described for the lines 84 to 120 of property schemata simple_instruction.

Reset

To generate the property about the reset values of the implementation, the macro $trigger_{init}$ was derived from the macro $TRIGGER_{init}$ by replacing the architecture reset signal with the implementation reset signal.

```
property reset;
assume:
   at   t: trigger_init;
prove:
   at   t+1: full_2 = 0;
   at   t+1: full_3 = 0;
   ...
   at   t+1: full_n = 0;
   # For each register R[k]
      at t+1:    current_R(k) = init_val_{R,k};
   # end for each register;
   at   t+1: PC = init_val_{PC};
   at   t+1: dbus_idle;
   at   t+1: process_new_instruction_state;
   right_hook: t+1;
end property;
```

For use in the proof below, the generated reset property is associated with points $t_1, t_2, \ldots t_n$ defined to be equal to t.

Auxiliary Property Schemata's

Restrictions about the macros from the correspondence information are captured in the following property schemata's. For all these property schemata's the macro triggers is derived from the macro $TRIGGER_0$ in the way presented for the property schemata simple_instruction.

cancel_correct: The property that is generated from this schemata ensures that the correspondence information for the $cancel_s$ instruction is correctly formed: If one stage is cancelled, all of the preceding stages must also be cancelled.

```
property cancel_correct;
dependencies: no_reset;
prove:
   at   t:   for each i in 2..n:
               if cancel_i = 1
               then cancel_{i-1} = 1
               end if;
             end for each;
end property;
``` stall_empty: This property schemata ensures that stages that do not execute an instruction are correctly flagged as empty by the correspondence information corresponding to the fulls macro. The macro triggers is the macro used in the properties above.

```
property stall_empty;
dependencies: no_reset;
prove:
   at   t:   for each i in 2 .. n
               if (not (full_{i-1} or (i−1 = int and trigger_0)) or stall_{i-1}) and
                  (not (full_i or (i = int and trigger_0)) or not stall_i)
               then
                  next(full_i) = 0;
               end if;
             end for each;
end property;
``` stall_full: This property schemata ensures that two instructions in adjacent ones of the stages will not merge.

```
property stall_full;
dependencies: no_reset;
prove:
   at   t:   for each i in 2 .. n:
               if (
                  (full_i or (i = int and trigger_0)) and
                  (full_{i-1} or (i−1 = int and trigger_0)) and
                  not stall_{i-1})
               then stall_i = 0
               end if;
             end for each;
end property;
``` full_slot: This property schemata ensures that the full, correspondence information correctly flags the stages that execute an instruction.

```
property full_slot;
dependencies: no_reset;
prove:
   at   t:   full_1 = 1 and
             for each i in 1 .. n−1:
               if ((full_i = 1 or (i = int and trigger_0)) and stall_i = 0 and
                  cancel_i = 0)
```

```
        then next(full_{i+1}) = 1
        end if;
    end for each and
    for each i in 2 .. n:
        if ((full_i= 1 or (i = int and trigger_0)) and stall_i = 1 and
        cancel_i = 0)
        then next(full_i) = 1
        end if;
    end for each;
end property;
``` empty_write: This property schemata ensures that an empty pipeline stage cannot write to a virtual register file. The empty_write property schemata must be replicated for every one of the architecture register files.

```
# for each register R file in the architectural state
property empty_write_R;
dependencies: no_reset;
prove:
at  t:   if (full_{dec+1} = 0) then result_write_{R,dec+1} = 0 end if and
         if (full_{dec+2} = 0) then result_write_{R,dec+2} = 0 end if and
         ...
         if (full_{writebackR} = 0) then result_write_{R,writebackR} = 0 end if;
end property;
# end for each register;
``` write_back: This property schemata ensures that the implementation register file current_R(k) for every architecture register file will not change if it is not updated.

```
# for each register R file in the architectural state
property write_back_R;
dependencies: no_reset;
prove:
at  t:   for each k in <index range of Ri>
             if (stall_{writebackR} = 1 or result_write_{R,writebackR} = 0 or
                 result_dest_{R,writebackR} /= k)
             then next(current_R(k)) = current_R(k)
             end if;
         end for each;
end property;
# end for each register;
``` empty_cancel: The property schemata empty_cancel states that the empty stages cannot initiate a cancel instruction. Moreover, the stages int and beyond cannot initiate a cancel instruction at all. This is a consequence from the relations between the stages.

```
property empty_cancel;
dependencies: no_reset;
prove:
at  t:   if (not full_2) then primary_cancel_1 = 0 end if and
         if (not full_3) then primary_cancel_2 = 0 end if and
         ...
         if (not full_{int-1}) then primary_cancel_{int-2} = 0 end if and
         if (not (full_{int} or trigger_0)) then primary_cancel_{int-1} = 0 end if
         and
         cancel_{int} = 0 and
         cancel_{int+1} = 0 and
         ... and
         cancel_n = 0;
end property;
``` interrupt_regs_valid: This property schemata requires that the values required to determine whether the interrupt is accepted are always valid.

```
# for each register R[k] evaluated in TRIGGER_0.
property interrupt_regs_valid_{R,k};
dependencies: no_reset;
prove:
at  t:     valid_{R,int}(k);
end property;
# end for each
```

Liveness Properties

The proofs above show the equivalence between the architecture and the implementation only if the stall signals will never generate a stall forever. The ensuing section is dedicated to the property schemata's from which the properties are generated that show that no stall will last forever, and that consequently, the execution of every interrupt or instruction takes only a finite number of clock cycles of the implementation.

There are algorithms available in the state of the art, which can prove such properties directly. However, these algorithms are limited with respect to complexity.

Let $w_1, w_2, w_3, \ldots w_n$ be a set of weights with $w_k > w_{k+1}$ and $0 < w_1$. The exact choice is not important. In the following, we chose the assignment $w_{n-k} = k+1$.

The total weight $total_s$ after the stage s in the pipeline is the sum of the weight of all full stages >s:

$$total_s = full_{s+1}*w_{s+1} + full_{s+2}*w_{s+2} + \ldots full_n*w_n$$

With the help of this definition of the total weight $total_s$, the following property schemata's are used to generate properties in order to show that the stalls in the stage s do not last forever.

```
property liveness_stall_s;
assume:
at t:       external_stall = 1;
prove:
at t+1:     (total_s <= prev(total_s)) or stall_s=0;
end property;
property liveness_nostall_s;
assume:
at t:       external_stall = 0;
prove:
at t+1:     (total_s < prev(total_s)) or stall_s = 0;
end property;
```

These properties schemata's show that each time there is no external stall, the total weight $total_s$ either actually decreases or there is no stalls of pipeline stage s in the sense of the correspondence. In the case of an external stall, the total weight $total_s$ can only increase if there is no $stall_s$. In other words, if stalls were active forever and the external stalls are not active forever, the total weight $total_s$ would have to become a negative number, which is a contradiction. Thus, the above two property schemata's prove generally that the stall signal to the stage s is not active indefinitely if the environment does not stall the processor indefinitely. Note that the property schemata's do not require explicit user input on the exact forwarding paths that are implemented. In other words, the user does not have to tediously model the exact condition when the instructions are stalled and when the instructions are not stalled. The above property schemata's form the minimum requirements that any pipelined processor has to fulfil.

In fact, these two property schemata's even prove liveness of a processor without any forwarding at all—the weight $total_s$ will decrease until it reaches 0. In that case, there are no more instructions in front of the stage s and hence there is no more internal reason to stall the stage s. In the absence of a memory stall, the instruction in stage s will therefore proceed to stage s+1.

Proof

This section shows that the proof of all generated properties is sufficient to prove equivalence between the architecture description and the implementation.

The Concept of the Proof

The situation examined by the proof follows the definition of the equivalence of the architecture description and the implementation description. An instruction memory with the same contents of the instructions is connected to both the implementation and the architecture. The instruction memory is treated as if the instruction memory were an asynchronous memory for the architecture. This means that the instruction memory returns the requested information from the instruction memory to a requester in the same cycle. For the implementation description, the instruction memory may have some latency that the implementation accounts for with stalls or by issuing the address and reading the instructions in different ones of the stages in the pipeline.

Similarly, a data memory is given for the architecture and the implementation with the same initial values. Again, in the view of the architecture description, the data memory is asynchronous and returns read data in the cycle in which the read data was requested. The data is written such that the data is available in the next cycle. For the implementation, the data memory might have some latency that is accounted for with stalls or by handling the address data and the read data in different ones of the pipeline stages.

It is assumed that the properties are generated according to the invention and that all of the properties were proven to hold on the implementation with a formal verification tool, as e.g. a property checker.

The proof will examine how the generated properties match execution traces of the implementation. These execution traces include the memory traffic and the behaviour on the interrupt signals irpt. The execution traces start with a reset behaviour according to the macro trigger$_{init}$, and provide no further activation of the reset later on. The proof will show that every execution trace can be matched (in the sense of the section on Terminology) with a chain $P_0$, $P_1$, $P_2$, $P_3$, . . . of properties generated from the following property schemata's: reset, simple_instruction, jump_instruction, and interrupt$_h$. These generated properties will be called main properties below.

It will be further shown that the behaviour of the implementation can be uniquely predicted solely on the base of the properties. Once the properties are proven against the implementation description, the implementation description could be discarded and it is possible to predict the implementation behaviour by reasoning about the properties, taking into account their logical interaction. The logical interaction between the generated properties uniquely predicts the accesses to the data memory and the instruction memory, given only the implementation interrupts irpt, the contents of the instruction memory represented by the input iw, the contents of the data memory represented by the read data input dbus_rdata, the behaviour of the stalls conditions, and the reset behaviour according to the restrictions from the last paragraph. For this part of the proof, the chain $P_0$, $P_1$, $P_2$, $P_3$, . . . of the main properties serves as a basic structure that is filled in with the properties generated from the auxiliary property schemata's from the section above. These properties will be called auxiliary properties below.

If the generated properties are verified by simulation this close logical interaction interrelation between the properties has the effect that one of the bugs in the implementation that corrupts the execution of the instruction or the interrupt will be identified by the respective property, at least if this one of the bugs may impact the execution of any ensuing instruction or interrupt.

The chain of main properties $P_0$, $P_1$, $P_2$, $P_3$, . . . that matches an execution trace relates to a sequence of architecture description entries about the reset behaviour ($P_0$), and the execution of instructions and interrupts ($P_i$ for i>0). This allows the definition of an interrupt mapping of the implementation interrupt inputs irpt to the interrupt inputs IRPT of the architecture. To this end it should be noted, that the matching of the chain of main properties $P_0$, $P_1$, $P_2$, $P_3$, . . . involves an instantiation of the time variables of each of the properties $P_0$, $P_1$, $P_2$, $P_3$, . . . . For every property $P_j$ generated from property schemata interrupt$_h$ in the execution sequence, the interrupt input IRPT @ j becomes irpt @ $t_{irpt}$, where $t_{irpt}$ is the time variable from the property schemata that underlies $P_j$. This time variable is instantiated to one time point by the way the chain of properties $P_0$, $P_1$, $P_2$, $P_3$, . . . is matched with the execution trace.

For every property $P_j$ generated from the property schemata's simple_instruction or jump_instruction, IRPT @ j becomes irpt @ $t_{init}$. This shows the existence of an interrupt mapping that is required by the definition of equivalence between implementation and architecture.

The proof will show that, if the architecture starts from the reset state defined in the architecture description and is provided with interrupt signals IRPT as defined above, the architecture will execute the same sequence of architecture description entries. The proof will also show that this execution deals with the same data according to an interpretation that is derived from the virtual register file and will be described in the course of the proof.

From this it is possible to deduce that the data memory accesses will be made with the same address data and the same write data, and in the same sequence. This in turn enforces that the same data is read in every one of the read transactions. This concludes the equivalence proof.

Data after a Property

It will now be shown how the implementation state is mapped to the architecture state by means of the virtual register file defined in the correspondence information. As a consequence of the mapping, each main property describes how the virtual register files become modified by the execution of the instruction or the interrupt that is described by that main property.

To this end, the stage function S is introduced: For a given finite sequence of time points $t_1$, $t_2$, . . . $t_w$, with $t_1 <= t_2$, $t_2 <= t_3$, . . . $t_{w-1} <= t_w$, as the sequence of time points $t_1$, $t_2$, . . . $t_w$, occurs in the main properties a function S(t) is defined such that the function S(t) returns -)    the value 1, if $t <= t_1$,
-)    the value i, if t lies in the interval $[t_{i-1}+1, t_i]$,
-)    w+1, if $t > t_w$.

In the context of the property schemata's simple_instruction and jump_instruction, the function S(t) returns the number of the stage at which the instruction is executed in dependency of the time, provided that t lies between $t_1$ and $t_n$. This is why this function S(t) is called the stage function for the sequence $t_1$, $t_2$, . . . $t_w$ of time points.

In the context of the property schemata interrupt$_h$, S(t) returns the number of the stage, at which the interrupt is executed in dependency of the time, provided that t>=$t_{irpt}$.

It will be shown that for every property in a chain of main properties that covers an execution trace, for all architecture register files R, and for all time points v and w, right_hook<v<w<=$t_{writebackR}$+1, the following consistency expressions for virtual register files hold $$valid_{R,S(v)-1}(k) @ v \rightarrow valid_{R,S(w)-1}(k) @ w$$
and $$valid_{R,S(v)-1}(k) @ v \rightarrow (data_{R,S(v)-1}(k) @ v = data_{R,S(w)-1}(k) @ w)$$

Once this is shown, further conclusions are: Since the expression valid$_{R,writebackR}$(k)=1 by definition, the expression valid$_{R,s(u)-1}$(k) at time point u becomes true at least for the time point u=$t_{writebackR}$+1. If the expression valid$_{R,witebackR}$(k) becomes true at an earlier time point, the data$_{R,s(u)-1}$(k) at time point u will be constant from this time point u onwards until the time point $t_{writebackR}$+1. It is therefore correct to speak of the one dedicated value that the virtual register file has after the virtual register file becomes valid as being the value of the virtual register file after a main property.

Main Induction Hypothesis

The proof is performed by induction. The induction hypothesis is that for all j>=0 the following conjectures hold:
1. For every execution trace following the reset restrictions from the section about the Proof Concept, there is a finite chain $P_0$, $P_1$, $P_2$, ..., $P_j$ of main properties that matches an initial part of the execution trace.
2. The consistency expressions for virtual register files hold for the main property $P_j$.
3. The value of every architecture register R[k] @ j+1 equals the value of the virtual register file after the main property $P_j$.
4. After the j-th architecture cycle the value of the architecture program counter PC @ j+1 equals the value of the implementation program counter pc at the time point right_hook+1 that is provided by the way the main property $P_j$ matches the execution trace of the implementation.
5. $P_j$ and the j-th architecture cycle describe the same transaction from or to the data memory.
6. Moreover, there is no interrupt accepted in the interval [right_hook+1, $t_{int}$] of $P_j$, i.e. trigger$_0$=false for all time points in this interval.

This induction hypothesis will be referred to as the main induction hypothesis in the following.

Base Case

The base case is about the reset of both the architecture and the implementation. The reset of the architecture provides register file values according to ACT$_{init}$, the activity block of the reset in the architecture description. This gives the register file values R[k] @1 and in addition the program counter value PC @1. The register values and the value of the program PC form the first architectural state AS$_{1.\}$ The application of the reset property onto the implementation sets all time points $t_1$, $t_2$, ... $t_n$ to t, the time point where the reset is activated. Consequently, the reset state of the implementation is reached at the time point t+1.\

Conjecture 1 of the main induction hypothesis is trivial in this context, because every execution trace is required to start with reset behaviour according to the function trigger$_{init}$. Therefore, the property $P_0$ generated from property schemata reset fits. Furthermore, the property $P_0$ describes no data memory access.

Conjecture 2 of the main induction hypothesis is trivial in this context, because in this case the interval [right_hook, $t_{writebackR}$+1] contains only one element.

Conjecture 3 is a direct consequence of the fact that all of the architecture registers are reset in the architecture to the same values as current$_R$ @ t+1 in the implementation.

Conjecture 4 holds because of the resetting of the program counter in both architecture and implementation.

Conjecture 5 holds, because the reset issues no data bus request.

Conjecture 6 holds, because the interval [right_hook+1, $t_{int}$] is empty.

The base case is verified by property schemata reset. It ensures that pc and all virtual register files contain the same values as the architecture after reset.

Induction Step

The induction step assumes that the induction hypothesis holds for j architecture cycles. It now has to be shown that the induction step also holds for the j+1$^{st}$ architecture cycle and the main property $P_{j+1}$. To this end it must be shown that there is a main property $P_{j+1}$ for every execution trace such that the chain $P_0$, $P_1$, $P_2$, ... $P_{j+1}$ of main properties matches an initial part of the execution trace. It must then be shown that the architecture executes the related architecture description entry and produces the same data.

The time points of main property $P_j$ will be denoted $T_0$, $T_1$, $T_2$, ... $T_n$ in the following. q will be chosen such that it is the highest index less or equal n with $T_q$=right_hook of the main property $P_j$.

Candidates for $P_{j+1}$

Because of the liveness of the stall signals, there is a first time point t'$_1$>$T_q$ with stall$_1$ @ t'$_1$=0, and a second time point t'$_2$>t'$_1$ with stall$_2$ @ t'$_2$=0 and so forth for the time points t'$_3$, ... t'$_n$. If the macro trigger$_0$ is satisfied somewhere in the interval [$T_{int}$+1, t'$_{int}$−1], then there is at least one interrupt accepted in this interval [$T_{int}$+1, t'$_{int}$−1]. Let $t_{irpt}$ be the first time point in that interval where an interrupt is accepted, i.e. the first time point such that trigger$_0$ @ $t_{irpt}$=1. In this situation, the only candidate that could become $P_{j+1}$ is one of the main properties generated from property schemata interrupt$_h$, where h=S($t_{irpt}$), with S being the stage function for t'$_1$, t'$_2$, ... t'$_n$. However, the applicability of such a property still needs confirmation. To ease this confirmation, the time points $t_0$, $t_1$, ... $t_n$ is defined in the way used in this property schemata, i.e. $t_0$=$T_q$, $t_1$=t'$_1$, $t_2$=t'$_2$, ... $t_{h-1}$=t'$_{h-1}$, $t_h$=$t_{irpt}$, $t_{h+1}$=$t_{irpt}$, ... $t_{int-1}$=$t_{irpt}$, $t_{int}$ is the first time point >=$t_{irpt}$ with stall$_{int}$ @ $t_{int}$=0, $t_{int+1}$ the first time point >$t_{int}$ with stall$_{int+1}$ @ $t_{int+1}$=0 and so forth for $t_{int+2}$, $t_{int+3}$, ... $t_n$.

If the macro trigger$_0$ is 0 on the whole interval [$T_{int}$+1, t'$_{int}$−1], the interrupt mapping is defined such that IRPT @ j+1 becomes irpt @ t'$_{int}$. In this situation irpt @ t'$_{int}$ may or may or may not yield an accepted interrupt, depending on whether trigger$_0$ @ t'$_{int}$ is 1 or 0. If there is an interrupt accepted, the property generated from property schemata interrupt$_{int}$ with $t_{irpt}$=$t_{int}$ is the candidate for $P_{j+1}$. If there is no interrupt, a property generated from property schemata simple_instruction or jump_instruction is the candidate for $P_{j+1}$. However, the applicability of such a property still needs confirmation. To ease this confirmation the time points $t_0$, $t_1$, ... $t_n$ is defined to be $t_0$=$T_q$, $t_1$=t'$_1$, $t_2$=t'$_2$, ... $t_n$=t'$_n$.

Once the proof is finished the section above provides a mapping from the interrupt inputs of the implementation to the interrupt inputs of the architecture as required by the definition of equivalence.

Empty Region

The timing relations between $P_j$ and the candidate for $P_{j+1}$ are exemplified in some figures:

FIG. 5 shows two of the main properties $P_j$ and $P_{j+1}$ generated from the property schemata simple_instruction.

FIG. 6 shows the general case of the property generated from property schemata's reset (q=n), jump_instruction (q=jmp$_m$), interrupt (q=int, if $t_{irpt}=t_{int}$, q=int−1, if $t_{irpt}<t_{int}$), or simple_instruction, followed by a property generated from the property schemata's simple_instruction or jump_instruction. It degenerates to FIG. 5 for the case q=1.

FIG. 7 shows the general case of one of the properties generated from the property schemata's reset, simple_instruction, jump_instruction, or interrupt$_h$ followed by a property generated from the property schemata interrupts, where q is assigned as indicated above.

The figures show instruction specific computations and a region of pairs (time, stage) between the instruction specific computations. For a given stage s, this region of pairs starts at $T_q+1=t_0+1$ for the stages s in [2, q], and at $T_s+1$ for the stages s>q. For a given one of the stages s, the region extends to the right until it terminates at the time points $t_{s-1}$ inclusively that were introduced above.

It will be shown about this region that the stages s are empty at the time points t in that region, i.e. that full$_s$ @ t=0 for all t in the interval [max($T_q$, $T_s$)+1, $t_{s-1}$]. This has two consequences: Firstly, it can be shown that the assume parts about the absence of cancels are satisfied; secondly it will be shown that the virtual register values after $P_j$ become the virtual register values that are being required by $P_{j+1}$.

The proof about the empty region will be executed by an induction in two dimensions: The induction in the direction of increasing stages will be executed by a base and a step case which are proven themselves by inductions over time.

In the following, it is not differentiated between the property generated from an auxiliary one of the property schemata and the auxiliary property schemata itself. The property <name> will therefore be written as an abbreviation for "a property generated from an auxiliary property schemata <name>". This is unambiguous, because there is always only one property generated from an auxiliary property schemata.

The base case for the induction over the stages s is s=2.

The base case for the induction over the time is t=max($T_q$, $T_2$)+1

If 2<=q, $P_j$ is generated from one of the property schemata's jump_instruction, interrupt$_h$, or reset. It cannot be generated from the property schemata simple_instruction, because this would be related to q=1. Consequently $T_2<=T_q$, and full$_2$ @ $T_q+1=0$ from the proof part of the main property $P_j$.

If q=1, there is only something to prove if the interval is not empty, which requires $T_2<t_1$. It is stall$_2$ @ $T_2=0$. Additionally, it is stall$_1$ @ $T_2=1$, because $t_1$ was defined to be the next time point after $T_1$ without a stall$_1$. From the property stall_empty then follows full$_2$ @ $T_2+1=0$.

Step case for the induction over the time: Let w be a time point in [$T_2+1$, $t_1-1$]. The induction hypothesis allows the assumption full$_2$ @ w=0. Then stall$_1$ @ w=1 (because $t_1$ is the first nostall of stage 1 after $T_1$) and from property stall_empty follows full$_2$ @ w+1=0.

This proves the base case for the induction over the stages.

Induction step from s to s+1: Let s be some stage in the interval [2, n−1]. From the induction hypothesis it follows that full$_s$=0 for all time points in [max($T_q$, $T_s$)+1, $t_{s-1}$].

The induction step over the stages is again proven by induction over time.

The base case t=max($T_q$, $T_{s+1}$)+1 requires case induction over the relation of q and s+1:

Firstly, s+1<=q is examined. This means that property $P_j$ is generated from property schemata reset, jump_instruction or interrupts. It proves directly full$_{s+1}$ @ $T_q+1=0$.

If q<s+1, the interval [max($T_q$, $T_{s+1}$)+1, $t_s$] only contains elements, if $T_{s+1}<t_s$. Out of the definition of q it is $T_s<T_{s+1}$, hence stall$_{s+1}$ @ $T_{s+1}=0$. A case split about the relation of $t_{s-1}$ and $T_{s+1}$ needs to be executed.

If $t_{s-1}<T_{s+1}$, then it is $T_{s+1}$ in the interval [$t_{s-1}+1$, $t_s-1$] and therefore stall$_s$ @ $T_{s+1}=1$. Then property stall_empty allows to conclude full$_{s+1}+1=0$.

If $T_{s+1}<=t_{s-1}$, then the time point $T_{s+1}$ lies in the interval [$t_s+1$, $t_{s-1}$]. Thus the hypothesis for the induction over the stages is applicable and shows full$_s$ @ $T_{s+1}=0$. If there is no interrupt accepted at $T_{s+1}$, or if s/=int, then the property stall_empty is applicable and shows full$_{s+1}$ @ $T_{s+1}+1=0$.

If s=int and an interrupt is accepted at $T_{s+1}$, then $T_{s+1}=t_{irpt}$. $t_{int}$ is defined to be the first time point with a nostall that is greater or equal $t_{irpt}$. As $t_{int}$ is expected to be >$T_{int+1}$, it follows stall$_s$ @ $T_{int+1}=1$. Thus, property stall_empty again shows full$_{int+1}$ @ $T_{int+1}+1=0$.

Step: Let full$_{s+1}$ @ w=0 be proven for some time point w in the interval [max($T_q$, $T_{s+1}$)+1, $t_s-1$].

To determine full$_{s+1}$ @ w+1, an interrupt accepted at time w=$t_{irpt}$ can only become relevant, if $t_{irpt}<t_s$. Thus, s=int. Moreover, stall$_{int}$ @ $t_{irpt}=1$. This allows the application of property stall_empty, which gives full$_{s+1}$ @ $t_{irpt}+1=0$.

For the remaining cases, an interrupt accepted at time w can therefore be excluded, or is irrelevant for the application of property stall_empty.

If w<=$t_{s-1}$, the induction hypothesis about the stage s is applicable, giving full$_s$ @ w=0. Therefore, property stall_empty is applicable, and this shows full$_{s+1}$ @ w+1=0.

If $t_{s-1}<w$, there is w in [$t_{s-1}+1$, $t_s-1$]. In this interval, there is stall$_s$ @ w=1, thus the application of property stall_empty delivers full$_{s+1}$ @ w+1=0.

This proves the induction step.

This proves the whole claim.

Cancels

Let t be a time point between (and including) $t_0+1=T_q+1$ and $t_n$. Let U(t) be the stage function related to the $T_1$, $T_2$, ... $T_n$. Let L(t) be the stage function related to the $t_1$, $t_2$, ... $t_n$.

Obviously, it is at least L(t)<=U(t). It will be shown later, that this can be strengthened to L(t)<U(t).

It will be proven that cancel$_{L(t)}$ @ t=0. This is done by proving that cancel$_s$ @ t=0 for all s in the interval [L(t), max(U(t), n)].

This can be seen by induction over s.

Base: If t<=$T_n$, then the assume part of main property $P_j$ delivers cancel$_{U(t)}$ @ t=0 and the prove part primary_cancel$_{U(t)-1}$ @ t=0. As $P_j$ was shown to be applicable, the assume part describes the situation. This shows cancel$_{U(t)-1}$ @ t=0. If t>$T_n$, then U(t)=n+1 and it follows from the property empty_cancel that cancel$_n$ @ t=0. This proves the base case.

Step: Let there be cancel$_s$ @ t=0 for some stage s in the interval [L(t)+1, U(t)−1]. If int<s, the induction hypothesis follows directly from the property empty_cancel: It is cancel$_{s-1}$ @ t=0. If s<=int, it is cancel$_{s-1}$ @ t=cancel$_s$ @ t or primary_cancel$_{s-1}$ @ t, because this is how primary_cancel is defined. From the induction hypothesis, it is cancel$_s$ @ t=0, from the property empty_cancel, it is primary_cancel$_{s-1}$ @ t=0 and thus cancel$_{s-1}$=0. This proves the step case and thus the whole claim.

A consequence of this proof is that it shows that the condition

```
during [t_0+1, t_1]: cancel_1 = 0;
during [t_1+1, t_2]: cancel_2 = 0;
during [t_2+1, t_3]: cancel_3 = 0;
...
during [t_{n-1}+1, t_n]: cancel_n = 0;
``` of the candidate property $P_{j+1}$ is satisfied.

Disjoint Slots

A slot from time point t and stage s is defined to be a sequence of time points $(t, t_{s+1}, t_{s+2}, \ldots t_n, t_n+1)$ with

```
at       t:               stall_s = 0;
during [t_s+1, t_{s+1}-1]: stall_{s+1} = 1;
at       t_{s+1}:         stall_{s+1} = 0;
...
during [t_{n-1}+1, t_n]:  stall_n = 1;
at       t_n:             stall_n = 0;
```

Instructions and interrupts are executed in slots. The instruction slots start at time $t_1$ in stage 1 and are proven to be marked by $full_s$ @ t for all $t>=T_q$ if the property $P_j$ was generated from the property schemata's simple_instruction or jump_instruction, the interrupt slots start at time $t_{int}$ in stage int and are proven to be marked by $full_s$ @ t if the property $P_j$ was generated from property schemata $interrupt_h$. For the instruction slots defined by the $t_1, t_2, \ldots t_n$ in case of instruction execution and for the interrupt slots defined by $t_{int}, t_{int+1}, \ldots t_n$ in case of interrupts, the property full_slot also shows that the $full_s=1$ @ t shows that stage s executes an instruction or an interrupt at time t.

This shows that the instruction slots or the interrupt slots of two instruction or interrupt executions will never merge: Let there be two slots that start at the same stage s at different time points t and t', where $full_s$ @ t=1 and $full_s$ @ t'=1; then the slots are disjoint in the sense, that for all stages i the intervals $[t_i+1, t_{i+1}]$ and $[t'_i+1, t'_{i+1}]$ are disjoint.

This can be seen as follows: Assume that t<t' and that there is some time point and some stage where the slots overlap, then there is some first stage s' for which the interval $[t_{s'-1}+1, t_{s'}]$ and $[t'_{s'-1}+1, t'_{s'}]$ intersect. As $stall_s=1$ for all but the last time point in both intervals, it can be concluded that $t_{s'}=t'_{s'}$. Therefore, $[t'_{s'-1}+1, t'_{s'}]$ is a subset of $[t_{s'-1}+1, t_{s'}]$. As a result of property full_slot it is $full_s=1$ for all time points in $[t_{s'-1}+1, t_{s'}]$. It is $t_{s'-1}<t'_{s'-1}$, because otherwise the intervals would also intersect in stage s'-1, and it was assumed that s' is the smallest such stage. Therefore, $full_{s'}$ @ $t'_{s'-1}=1$ and $full_{s'-1}$ @ $t'_{s'-1}=1$. From the definition of the slot, it is also $stall_{s'-1}$ @ $t'_{s'-1}=1$ and this forms a contradiction to property stall_full.

This shows that the execution of two instructions will never merge. Consequently, L(t)<U(t).

Register Values

For every architecture register R[k] it is proven that for two time points v<=w, both in interval $[t_{dec-1}+1, t_{writebackR}]$ that $$valid_{R,L(v)} @ v \rightarrow valid_{R,L(v)} @ w \text{ and}$$
$$valid_{R,L(v)} @ v \rightarrow data_{R,L(v)}(k) @ v = R[k] @ j+1$$

The last equality is a consequence from the main induction hypothesis. Additionally for all registers R[k] on which $TRIGGER_0$ depends and for all v in the interval $[T_{int}+1, t_{int}]$ it will be proven $$valid_{R,int}(k) @ v \text{ and } (data_{R,int}(k) @ v = R[k] @ j+1)$$

To this end, one of the registers R[k] and one time point t from the interval $[t_0+1, t_n]$ is examined. As $valid_{R,s}$ and $data_{R,s}$ are only defined for pipeline stages s in the interval [dec, $writeback_R$], functions must be derived from the stage functions U and L that account for this limitation. Let l(t) be max(dec, L(t)) and u(t) be min(U(t), $writeback_R+1$). Then it is proven by induction that for all stages s in [l(t), u(t)-1] it is $$valid_{R,s}(k) @ t=valid_{R,u(t)-1}(k) @ t$$

Proof: There is nothing to be shown in the base case s=u(t)-1.

Step from s to s-1: Let above claim hold for some s in [l(t)+1, u(t)-1]. Then it is from the definition $$valid_{R,s-1}(k) @ t = (if (result\_write_{R,s} \text{ and } result\_dest_{R,s} = k)$$
$$\text{then } result\_valid_{R,s}$$
$$\text{else } valid_{R,s}(k)) @ t$$

Property empty_write is applicable, taking into account that $full_s$ @ t=0, therefore $result\_write_{R,s}=0$, and hence $valid_{R,s-1}(k)$ @ t=$valid_{R,s}(k)$ @ t. This proves the step and the claim.

Moreover, it will be proven that $$valid_{R,s}(k) @ t \rightarrow data_{R,s}(k) @ t=R[k] @ j+1$$

Base case: To this end the claim will first be proven for s=u(t)-1. There is nothing to prove as long as $t<=T_n+1$, because this is an immediate consequence from the induction hypothesis. If t is from the interval $[T_n+1, t_{n-1}]$ it is $full_{writebackR}$ @ t=0, hence the property $empty\_write_R$ delivers the result $result\_write_{R,writebackR}$ @ t=0 and the property $write\_back_R$ allows the conclusion that $data_{R,writebackR}(k)$ @ t+1=$data_{R,writebackR}(k)$ @ t=R[k] @ j+1. If t is from the interval $[t_{n-1}+1, t_n-1]$ the same equation follows from $stall_n=1$ and the property $write\_back_R$. Thus above claim holds for s=u(t).

Step from s to s-1: The reasoning for the step from s to s-1 follows the reasoning about $valid_{R,s}(k)$. It is by definition $$data_{R,s-1}(k) @ t =$$
$$(if result\_write_{R,s} \text{ and } result\_dest_{R,s} = k$$
$$\text{then } result\_data_{R,s}$$
$$\text{else } data_{R,s}(k)) @ t$$

Since $result\_write_{R,s}$ @ t=0 (from property empty_write) it is $data_{R,s-1}(k)$ @ t=$data_{R,s}(k)$ @ t=R[k] @ j+1.

The claim about $valid_{R,int}(k)$ and $data_{R,int}(k)$ is a consequence from the last proof, because property interrupt_regs_$valid_{R,k}$ guarantees the validity. The first claim from this section is a consequence from the reasoning about $valid_{R,s}(k)$, $data_{R,s}(k)$, the fact that $valid_{R,writebackR}=1$ by definition and the induction hypothesis.

Application of a Property Generated from Property Schemata $interrupt_h$

The following will show that the property $P_{j+1}$ generated from one of the three property schemata's simple_instruction, jump_instruction, or $interrupt_h$ is always applicable. It will now be shown that if the candidate for the property $P_{j+1}$ is generated from property schemata $interrupt_h$, the property is indeed applicable:

If time variables from the property are instantiated with the time points $t_0, t_1, \ldots t_n$ and $t_{irpt}$ as defined above, the conditions about the stalls and triggers (line 25 to 46 in property schemata $interrupt_h$ are all satisfied. Moreover, the section about cancels shows that the assume part about the cancels (line 48 to 56) is satisfied, and the section about the empty region proves the assumptions about the values $full_{h+1}$, $full_{h+2}$, ... $full_{int}$ (line 62 to 65).

The assumption about process_new_instruction @ $t_0$ on line 59 is discharged by the proof of process_new_instruction @ $T_q$ in main property $P_j$.

This shows that one of the property schemata's $interrupt_h$ is applicable.

The interrupt mapping and the reasoning about the architecture registers and the virtual registers show that $TRIGGER_0$ @ j+1 will evaluate the same values in the same way as $trigger_0$ @ $t_{irpt}$. Thus, the architecture will execute an interrupt in its j+1$^{st}$ cycle.

It must now be shown that the main induction hypothesis is valid for j+1.

Conjecture 1 requires a look at all possible main properties. Therefore, for the current state of the proof it can only be noted, that a $P_{j+1}$ exists whenever there should be an interrupt.

Conjecture 2 requires a proof of the consistency expressions for the virtual register after $P_{j+1}$.

Let R[k] be an architecture register. Let v<=w be two time points from the interval [$t_{int}$+1, $t_{writebackR}$+1], and S be the stage function related to the time point $t_1, t_2, t_3, \ldots t_n$ $$valid_{R,S(v)-1}(k) @ v =$$
$$(if (result\_write_{R,S(v)} \text{ and } result\_dest_{R,S(v)} = k)$$
$$then\ result\_valid_{R,S(v)}$$
$$else\ valid_{R,S(v)}(k))\ @ v$$

and $$valid_{R,S(w)-1}(k) @ w =$$
$$(if (result\_write_{R,S(w)} \text{ and } result\_dest_{R,S(w)} = k)$$
$$then\ result\_valid_{R,S(w)}$$
$$else\ valid_{R,S(w)}(k))\ @ w$$

Main property $P_j$ determines that $result\_write_{R,s(v)}$ @ v=$result\_write_{R,S(w)}$ @ w. If both are 1, then $result\_dest_{R,S(v)}$ @ v=$result\_dest_{R,S(w)}$ @ w, because both are equal to $index_{0,R}$, which is derived from $INDEX_{0,R}$ by replacing the architecture objects by expressions that evaluate a signal at one dedicated point of time.

Therefore, either $valid_{R,s(v)-1}(k)$ @ v=$result\_valid_{R,S(v)}$ @ v and $valid_{R,S(w)-1}(k)$ @ w=$result\_valid_{R,S(w)}$ @ v, or $valid_{R,s(v)-1}(k)$ @ v=$valid_{R,s(v)}(k)$ @ v and $valid_{R,s(w)-1}(k)$ @ w=$valid_{R,s(w)}(k)$ @ w. In both cases, the implication $$valid_{R,L(v)-1}(k) @ v -> valid_{R,L(v)-1}(k) @ w$$

holds. The first is a consequence from the proof part of $P_{j+1}$, the second is a consequence from the reasoning about registers.

Similar considerations show the equality of the values $data_{R,S(v)-1}(k)$ @ v and $data_{R,S(w)-1}$ @ w. If $valid_{R,L(v)-1}(k)$ @ v=1, then $result\_write_{R,S(v)}$ @ v=$result\_write_{R,S(w)}$ @ w and $result\_dest_{R,S(v)}$ @ v=$result\_dest_{R,S(w)}$ @ w, which is a direct consequence of the proof part of main property $P_{j+1}$. Therefore, either $valid_{R,L(v)-1}(k)$ @ v=$result\_valid_{R,L(v)}$ @ v=1, hence $result\_valid_{R,L(w)}$ @ w=1 and therefore $data_{R,S(v)-1}$ @ v=$update_{0,R}$ @ v and $data_{R,S(w)-1}$ @ w=$update_{0,R}$ @ w. In this case both expressions are equal, because $update_{0,R}$ is derived from $UPDATE_{0,R}$ by replacing all architecture objects by expressions that reference the implementation signals at one dedicated point of time.

In the case of $data_{R,S(v)}$ @ v=$data_{R,S(v)-1}$ @ v and $data_{R,S(w)}$ @ w=$data_{R,S(w)-1}$ @ w the equality follows from the considerations about the register file values. This proves conjecture 2 of the main induction hypothesis.

Therefore, it is possible to speak about a value of R[k] after the main property. $P_{j+1}$. This value is computed as follows.

Let t be a time point from the interval [$t_{irpt}$+1, $t_{writebackR}$+1], such that $valid_{R,L(t)-1}(k)$ @ t=1. Then $$data_{R,L(t)-1}(k) @ t =$$
$$(if\ result\_write_{R,L(t)}\ and\ result\_dest_{R,L(t)} = k$$
$$then\ result\_data_{R,L(t)}$$
$$else\ data_{R,L(t)}(k))\ @ t$$

If $result\_write_{R,L(t)}$ and $result\_dest_{R,L(t)}$=k @ t is satisfied, it is $valid_{R,L(t)-1}(k)$ @ t=$result\_valid_{R,L(t)}$ @ t and $data_{R,L(t)-1}(k)$ @ t=$result\_data_{R,L(t)}$, the proof part of $P_{j+1}$ then assures $result\_data_{R,L(t)}$ @ t=$update_{0,R}$ @ $t_{irpt}$ where $update_{0,R}$ evaluates signals at dedicated time points defined by the way $update_{0,R}$ is derived from $UPDATE_{0,R}$ such that it is independent of the point of time where $update_{0,R}$ itself is evaluated. Also k=$index_{0,R}$ @ $t_{irpt}$, which is again independent of the time point of evaluation. A proof part entry assures that all virtual register values being read in $update_{0,R}$ are valid, thus the main induction hypothesis shows that they are equal to the related values of R[k] @ j+1. Therefore $update_{0,R}$ @ t=$UPDATE_{0,R}$ and $index_{0,R}$ @ t=$INDEX_{0,R}$ @ j+1, such that R[k] @ j+2=$data_{R,L(t)-1}(k)$ @ t.

If $result\_write_{R,L(t)}$ and $result\_dest_{R,L(t)}$=k is not satisfied, similar considerations show that R[k] @ j+1=R[k] @ j+2 and therefore again R[k] @ j+2=$data_{R,L(t)-1}(k)$ @ t. This proves conjecture 3 of the main induction hypothesis.

Similarly, the equality of the PCs after instruction $P_{j+1}$ and the j+1$^{st}$ architecture cycle are shown to prove conjecture 4.

Likewise, it can be shown that implementation and architecture perform equal memory transactions, thus proving conjecture 5.

The requirement that there is no interrupt accepted between [right_hook+1, $t_{int}$] of $P_{j+1}$ follows from the respective proof part, and this proves conjecture 6.

Application of Properties Generated from Property Schemata simple_instruction or jump_instruction Now the case in which no interrupt is accepted in the interval [$T_{int}$+1, $t_{int}$] is considered. In this case there are also time points $t_0, t_1, t_2, \ldots$ defined above, and if the time variables of a property generated from the property schemata simple_instruction or jump_instruction schemata are instantiated accordingly, the assumption about the stall behaviour (lines 13 to 21 in the property schemata's simple_instruction and jump_instruction) is again satisfied.

The reasoning about the cancel behaviour shows that the related assumptions (lines 24 to 28) are satisfied.

The assumption about process_new_instruction @ to (line 31) is discharged by the proof of process_new_instruction @ $T_q$ in main property $P_j$.

This shows that the assume part of the partial property simple_instruction.fetch or jump_instruction.fetch is satisfied. Therefore it is proven that a read access to the instruction memory is executed with the address pc @ $t_1$, which equals PC @ j+1 due to the induction hypothesis. Therefore, the instruction memory returns the same instruction word iw @ $t_{iv}$ for the implementation and IW @ j+1 for the architecture.

It is mentioned above that as a prerequisite for this examination the instruction memory only returns valid instructions. Therefore, there is at least one, and possibly even multiple architecture description entries with $TRIGGER\_IW_m$=1. For all these architecture description entries, the assumptions $trigger\_iw_m$ of the partial properties simple_instruction.validate_regs or jump_instruction.validate_regs are now satisfied. This shows that all $trigger\_state_m$ are evaluated on the base of valid virtual register values. Similar to the reasoning for interrupts above it can be seen that trigger_state$_m$ @ t$_{dec}$=TRIGGER_STATE$_m$ @ j+1. It belongs to the requirements of this examination, that the possibly multiple TRIGGER_STATE$_m$ for the same TRIGGER_IW$_m$ form a full case split. Thus, there is one specification entry m where TRIGGER_STATE$_m$ and TRIGGER_IW$_m$ are both satisfied. The generated property for this entry will become P$_{j+1}$. Its applicability has already been shown.

This shows that for all execution traces that have initial parts that are already matched by a chain, P$_0$, P$_1$, P$_2$, . . . P$_j$ of main properties always a main property P$_{j+1}$ can be found that makes the chain P$_0$, P$_1$, P$_2$, . . . P$_{j+1}$ of main properties match a longer initial part of the execution trace.

This proves conjecture 1 of the main induction hypothesis.

The conjecture 2, 3, 4, and 5 of the main induction hypothesis are shown as above for the property generated from property schemata interrupt$_h$.

Then, given any execution trace that is matched by the chain P$_0$, P$_1$, P$_2$, . . . P$_j$, of main properties there is an instantiation of the time variables of P$_j$ and according to this instantiation, conjecture 6 of the induction hypothesis allows to assume trigger$_0$=0 for all time points in the interval [T$_q$+1, T$_{int}$] (the T relate to the time points of P$_j$). For the time variable to of P$_{j+1}$, there is t$_0$<=T$_{int}$. Therefore, trigger$_0$=0 for all time points in [t$_0$+1, T$_{int}$]. An interrupt accepted in the interval [T$_{int}$+1, t$_{int}$] is handled by the section about the application of a property generated from property schemata interrupt$_h$, if P$_{j+1}$ is generated from the property schemata's simple_instruction or jump_instruction, there is no interrupt accepted in [T$_{int}$+1, t$_{int}$]. This proves conjecture 6 of the main induction hypothesis.

This concludes the proof. One important consequence of the proof is that if the correspondence information is provided such that all generated properties can be proven to hold on the implementation, the exact shape of the correspondence information is irrelevant. Therefore, the correspondence information cannot make the verification process falsely output equivalence for a non equivalent pair of the architecture description and the implementation description.

Application Example

The user inputs were demonstrated using a small example processor with the following features:

It has one register file REG with 8 registers.
It has a program counter PC
It is implemented by a 4 stage pipeline.
It supports forwarding.
It supports stalls initiated by the data memory.
It supports some exemplary instructions. These instructions will be listed next, and the operands of the instructions are described. The full instruction consists of an opcode to select what has to be done and the operands need to be interpreted according to the opcode. All this is to be decoded from the instruction word. The list of instructions is:

NOT: A register is selected by the command, its contents bitwise negated and the result is stored at a destination register the address of which is also given in the instruction.

ADD/SUB: Two source operand registers are selected by the command and the result is written into a destination address the address of which is given by the instruction.

LD: A register is selected by the instruction to provide some base address. An offset provided by the instruction will be added to the base address. This gives an address from which data is loaded from the data memory.

ST: A register is selected by the instruction to provide a base address. An offset provided by the instruction will be added to the base address. This gives the address of a write request for the data memory. The instruction also provides the address of the register the data of which is to be stored.

BEQZ: A register is selected by the instruction. If this register is 0, a jump will be executed. Execution of the jump means that an offset provided by the instruction is added to the address where the instruction is found in the instruction memory; this gives the address of the next instruction. If the register is not 0, the jump will not be executed and the program counter will be incremented by the size of the instruction.

In case of the instruction BEQZ, the processor speculates that the instruction is not taken. The condition that the source register file is 0 is checked in the $2^{nd}$ stage, which can lead to cancel instructions in stage 1.

Interrupts arrive at the processor via the signal int_valid_i. The interrupts are accepted if the register REG[0] is 0. The address to which the processor should return after an interrupt service routine will be stored in the register REG[0]. In case of the interrupt the start address of the interrupt service routine is provided via the input int_addr_i, which belongs to the interrupt inputs.

Architecture

Architecture Inputs

Besides the standardized memory inputs (see the description above) the architecture has the input INT_VALID_I on which the interrupt may arrive, an input INT_ADDR_I to define the first address of the interrupt service routine and an input RESET_N to reset the processor.

Architecture States

The architecture states are the register file REG and the program counter PC.

Architecture description Entries

Initialization

The processor is initialized by activation of the reset. This initialisation is captured by the following expression:

TRIGGER$_{init}$:=RESET_$N$=0;

After the initialization is completed, the processor is in a state in which all architecture states yield 0. The corresponding activity block ACT$_{init}$ is therefore:

| | | |
|---|---|---|
| PC := | 0; | |
| REG[0] := | 0; | |
| REG[1] := | 0; | |
| REG[2] := | 0; | |
| REG[3] := | 0; | |
| REG[4] := | 0; | |
| REG[5] := | 0; | |
| REG[6] := | 0; | |
| REG[7] := | 0; | |

Interrupt

The condition under which an interrupt is accepted is given by

TRIGGER$_0$:=INT_VALID_$I$ and REG[0]=0;

The following activity block ACT$_0$ describes the execution of the interrupt according to what was said above.

| | |
|---|---|
| UPDATE$_{0,PC}$ := | INT_ADDR_I; |
| UPDATE$_{0,REG}$ := | PC; |
| INDEX$_{0,REG}$ :=0; | |
| DMEM_IDLE$_0$ | |

The last entry of the activity block refers to the fact that no access to the data memory is executed.

Arithmetic/Logical Instructions

It is assumed that constants add, sub, not, etc. are defined that contain the opcode for the related instruction.

The way arithmetic/logical instructions are executed does not depend on the processor state but solely on the instruction word. This is reflected by the triggers. For instruction ADD the trigger is:

$$\text{TRIGGER\_IW}_1 := \text{IW}[15:11] = \text{add};$$
$$\text{TRIGGER\_STATE}_1 := \text{true};$$

The activity block specifies the PC increment and the update of register file REG according to the instruction.

$$\text{UPDATE}_{1,PC} := (\text{PC} + 2)[7:0];$$
$$\text{UPDATE}_{1,REG} := (\text{REG}[\text{IW}[10:8]] + \text{REG}[\text{IW}[7:5]])[15:0];$$
$$\text{INDEX}_{1,REG} := \text{IW}[4:2];$$
$$\text{VINDEX}_{1,1} := \text{IW}[7:5];$$
$$\text{VINDEX}_{1,2} := \text{IW}[10:8];$$
$$\text{DMEM\_IDLE}_1$$

Similar for instruction SUB:

$$\text{TRIGGER\_IW}_2 := \text{IW}[15:11] = \text{sub};$$
$$\text{TRIGGER\_STATE}_2 := \text{true};$$
$$\text{UPDATE}_{2,PC} := (\text{PC} + 2)[7:0];$$
$$\text{UPDATE}_{2,REG} := \text{unsigned}((\text{REG}[\text{IW}[10:8]] - \text{REG}[\text{IW}[7:5]])[15:0])$$
$$\text{INDEX}_{2,REG} := \text{IW}[4:2];$$
$$\text{VINDEX}_{2,1} := \text{IW}[7:5];$$
$$\text{VINDEX}_{2,2} := \text{IW}[10:8];$$
$$\text{DMEM\_IDLE}_2$$

Instruction NOT $$\text{TRIGGER\_IW}_3 := \text{IW}[15:11] = \text{not};$$
$$\text{TRIGGER\_STATE}_3 := \text{true};$$
$$\text{UPDATE}_{3,PC} := (\text{PC} + 2)[7:0];$$
$$\text{UPDATE}_{3,REG} := \sim \text{REG}[\text{IW}[10:8]]$$
$$\text{INDEX}_{3,REG} := \text{IW}[4:2];$$
$$\text{VINDEX}_{3,1} := \text{IW}[10:8];$$
$$\text{DMEM\_IDLE}_3$$

Memory Instructions

The interesting part of the memory instructions is that the activity block contains the entry DMEM_READ or DMEM_WRITE, and that the activity blocks of read instructions use the macro DMEM_RDATA for the read data.

Instruction LD $$\text{TRIGGER\_IW}_4 := \text{IW}[15:11] = \text{ld};$$
$$\text{TRIGGER\_STATE}_4 := \text{true};$$
$$\text{UPDATE}_{4,PC} := (\text{PC} + 2)[7:0];$$
$$\text{UPDATE}_{4,REG} := \text{DMEM\_RDATA};$$
$$\text{INDEX}_{4,REG} := \text{IW}[10:8];$$
$$\text{VINDEX}_{4,1} := \text{IW}[7:5];$$
$$\text{DMEM\_READ}_4((\text{IW}[4:0] + \text{REG}[\text{IW}[7:5]])[7:0])$$

Instruction ST $$\text{TRIGGER\_IW}_5 := \text{IW}[15:11] = \text{st};$$
$$\text{TRIGGGER\_STATE}_5 := \text{true};$$
$$\text{UPDATE}_{5,PC} := (\text{PC} + 2)[7:0];$$

No assignment to REG $$\text{VINDEX}_{5,1} := \text{IW}[10:8];$$
$$\text{VINDEX}_{5,2} := \text{IW}[7:5]$$
$$\text{DMEM\_WRITE}_5((\text{IW}[4:0] + \text{REG}[\text{IW}[7:5]])[7:0], \text{REG}[\text{IW}[10:8]])$$

Conditional Jump

The conditional jump has two essentially different behaviours, depending on whether or not the jump is taken. This is reflected by two architecture description entries with non-trivial trigger_state macros. The example instruction is BEQZ Jump not taken $$\text{TRIGGER\_IW}_6 := \text{IW}[15:11] = \text{beqz};$$
$$\text{TRIGGER\_STATE}_6 := \text{REG}[\text{IW}[10:8]] \mathrel{/}= 0;$$
$$\text{UPDATE}_{6,PC} := (\text{PC} + 2)[7:0];$$
$$\text{VINDEX}_{6,1} := \text{IW}[10:8];$$
No update for REG.
$$\text{DMEM\_IDLE}_6$$

Jump taken $$\text{TRIGGER\_IW}_7 := \text{IW}[15:11] = \text{beqz};$$
$$\text{TRIGGER\_STATE}_7 := \text{REG}[\text{IW}[10:8]] = 0;$$
$$\text{UPDATE}_{7,PC} := (\text{PC} + \text{IW}[7:0])[7:0];$$
$$\text{INDEX}_{7,1} := \text{IW}[10:8];$$
NO update for REG.
$$\text{DMEM\_IDLE}_7$$

Correspondence Information
Classification of the Pipeline Stages
The total number of pipeline stages is $n=4$ Also, decoding is done in the second stage:

$dec=2$

Most of the architecture description entries do not refer to a jump. Only the last one of the architecture description entries is about a jump taken, and this jump is decided in the $2^{nd}$ stage, such that the only stage to be cancelled is the stage 1.

| | |
|---|---|
| $\text{jmp}_1$ | $= 1$ |
| $\text{jmp}_2$ | $= 1$ |
| $\text{jmp}_3$ | $= 1$ |
| $\text{jmp}_4$ | $= 1$ |
| $\text{jmp}_5$ | $= 1$ |
| $\text{jmp}_6$ | $= 1$ |
| $\text{jmp}_7$ | $= 2$ |

An interrupt is accepted in stage 3. This means that an instruction in stage 4 will not be cancelled by the interrupt, whereas all of the other instructions will be cancelled by the interrupt.

$int=3$

There is only one architecture register file REG, and the data will be written back from stage 4.

$writeback_{REG}=4$

All of the data in the processor is forwarded to the decode stage which is stage 2. Therefore, all of the data that is needed by the instruction must be valid when this instruction is in stage 2 and when stage 2 does not stall.

| | |
|---|---|
| $vstage_{1,1}$ | = 2; |
| $vstage_{1,2}$ | = 2; |
| $vstage_{2,1}$ | = 2; |
| $vstage_{2,2}$ | = 2; |
| $vstage_{3,1}$ | = 2; |
| $vstage_{4,2}$ | = 2; |
| $vstage_{5,2}$ | = 2; |
| $vstage_{6,1}$ | = 2; |
| $vstage_{7,1}$ | = 2; |

Stall Conditions

The example processor does not have one dedicated stall signal per each stage. Instead, the stall conditions are composed of several signals. This is captured by the correspondence information about the stalls. This correspondence information was obtained by the designer who explained the conditions under which the related stages do not move the instruction forward.

| | | |
|---|---|---|
| $stall_1$ | := | id_stall && id_full; |
| $stall_2$ | := | id_stall; |
| $stall_3$ | := | mem_stall \|\| stall_i; |
| $stall_4$ | := | mem_stall; |

Cancel Conditions

The processor does not have dedicated cancel signals. Again, the cancel conditions are expressed by expressions rather than single signals.

| | | |
|---|---|---|
| $cancel_1$:= | (!id_stall && opcode == beqz && full_2) \|\| int_valid_i; | |
| $cancel_2$:= | int_valid_i; | |
| $cancel_3$:= | 0; | |
| $cancel_4$:= | 0; | |

Full Conditions

| | | |
|---|---|---|
| $full_2$ | := | id_full && !id_squash; |
| $full_3$ | := | ex_full; |
| $full_4$ | := | ma_full; |

Start State process_new_instruction_state:=true;

Program Counter pc:=if_Pc;

Registers

The processor has only the register file REG.

| | |
|---|---|
| $result\_write\_REG_3$ | := ex_full && ex_write_reg && !int_valid_i; |
| $result\_write\_REG_4$ | := ma_full && ma_write_reg; |

-continued

| | |
|---|---|
| $result\_valid\_REG_3$ | := ex_full && !ex_read_from_mem; |
| $result\_valid\_REG_4$ | := ma_full && !mem_stall; |
| $result\_dest\_REG_3$ | := ex_dest_reg; |
| $result\_dest\_REG_4$ | := ma_dest_reg; |
| $result\_data\_REG_3$ | := ex_result; |
| $result\_data\_REG_4$ | := real_ma_result; |
| current_REG(unsigned reg_no) | := register[reg_no]; |

Access Protocol Description

The instruction memory address is passed in the first stage:

$ia=1$

The instruction itself arrives when the execution is in the second stage:

$iv=2$

The communication with the data memory is split into the stage 3 (to pass the address) and stage 4, to receive read data.

$da=3$ $dv=4$

These macros describe how the processor signals read to the instruction memory and reads or writes to the data memory.

| | |
|---|---|
| ibus_read(net[ ] pc) | := imem_addr_o == pc; |
| iw := | instruction_word; |
| dbus_idle | := !ex_dmem_enable_o \|\| int_valid_i; |
| dbus_read(net[ ] addr) | := ex_dmem_enable_o |
| | && ! ex_dmem_write_o |
| | && ex_result[7:0] == addr; |
| dbus_rdata | := dmem_data_i; |
| dbus_write(net[ ] addr, wdata) | := ex_dmem_enable_o |
| | && ex_dmem_write_o |
| | && ex_result[7:0] == addr |
| | && ex_dmem_data_o == wdata; |

Property Generation

The generation of the property for the add instruction is sketched in this section.

The correspondence information about the register file REG is combined according to the section "Virtual Register File" to build the macros $data\_REG_s(k)$ and $valid\_REG_s(k)$ for all applicable stages s, i.e. for the stages 2, 3, or 4.

Next, the appropriate property schemata is to be selected. In the case of the ADD instruction which is described in the architecture description entry 1, the user specified with the correspondence information $jmp_1=1$ that the architecture description block does not specify a jump instruction. Thus, property schemata simple_instruction is to be applied.

Then the architectural state needs to be replaced by implementation signals. In this step, the macros $TRIGGER_0$, $TRIGGER\_IW_1$, $TRIGGER\_STATE_1$, $INDEX_{1,R}$, $UPDATE_{1,R}$, $UPDATE_{1,PC}$, $VINDEX_{1,i}$, $ADDR_1$ and $WDATA_1$ have to be replaced by $trigger_0$, $trigger\_iw_1$, $trigger\_state_1$, $index_{1,R}$, $update_{1,R}$, $update_{1,PC}$, $vindex_{1,i}$, $addr_1$, and $wdata_1$. According to the rules described for this transformation the replacement for $TRIGGER_0$ is $trigger_0=int\_valid\_i$ and $data\_REG_3(0)$ Taking note of the correspondence information, the related replacements will be given below. Wherever useful, the result of the direct replacement is presented together with a more readable form.

```
ibus_read(iaddr)      = imem_addr_o = iaddr;
trigger_iw₁           = ((iw @ t₂)[15:11] = add)
                      = (iw[15:11] @ t2 = add)
trigger_state₁        = true;
update₁,PC            = ((pc @ t₁) + 2)[7:0];
update₁,REG           = ((data_REG₂ @ t₂)((iw @ t₂)[10:8])) +
                        ((data_REG₂ @ t₂)((iw @ t₂)[7:5]))
                      = (data_REG₂(iw[10:8]) + data_REG₂(iw[7:5])) @
index₁,REG            = (iw @ t₂)[4:2]
                      = iw[4:2] @ t₂;
vindex₁,₁             = (iw @ t₂)[10:8];
vindex₁,₂             = (iw @ t₂)[7:5];
```

As the activity block $ACT_1$ specifies DMEM_IDLE (which means that no memory access is made), replacements for $DATA_1$ and $WADDR_1$ are not needed.

Now all placeholders of the property schemata are provided in the form of macros. What remains to be done is to expand the property schemata for the instruction and the implementation. This expansion already provides the required property into which the macros are expanded during the proof of the property against the implementation.

```
property add_instruction;
dependencies: no_reset;
for time_points:
        t₀ = t,
        t₁ > t₀,
        t₂ > t₁,
        t₃ > t₂,
        t₄ > t₃
assume:
//Describe the slot that is occupied by the instruction
at       t₀:              stall₁ = 0 || cancel₁ = 1;
during [t₀+1, t₁-1]:      stall₁ = 1;
at       t₁:              stall₁ = 0;
during [t₁+1, t₂-1]:      stall₂ = 1;
at       t₂:              stall₂ = 0;
during [t₂+1, t₃-1]:      stall₃ = 1;
at       t₃:              stall₃ = 0;
during [t₃+1, t₄-1]:      stall₄ = 1;
at       t₄:              stall₄ = 0;
// assume that no preceding property cancelled this one
during [t₀+1, t₁]:        cancel₁ = 0;
during [t₁+1, t₂]:        cancel₂ = 0;
during [t₂+1, t₃]:        cancel₃ = 0;
during [t₃+1, t₄]:        cancel₄ = 0;
//assume that the processor is ready to execute next instruction
at       t₀:              process_new_instruction_state;
//assume that instruction execution is not interrupted.
during [t₀+1, t₃]:        not trigger₀;
<fetch> // This is a cut point, see ITL section
//assume that iw contains the instruction
//that should be handled in this property.
at       t₂:              trigger_iw₁;
<validate_regs>
at       t₂:              trigger_state₁;
prove:
at       t₁:              ibus_read(pc @ t₀+1);
<fetch>
//Prove that the virtual register file values are valid
//whenever they are to decide upon trigger_state.
//... trigger_state does not reference them here.
<validate_regs>
//Prove that the virtual register file values are valid
//whenever they are required.
at       t₂:              valid_REG,2(vindex₁,₁);
at       t₂:              valid_REG,2(vindex₁,₂);
at t₁:                    process_new_instruction_state;
at t₁+1:                  pc = update₁,PC;
//Prove that the full signals are correctly created.
during [t₁+1, t₂]:        full₂ = 1;
during [t₂+1, t₃]:        full₃ = 1;
during [t₃+1, t₄]:        full₄ = 1;
//Prove that this instruction will not initiate cancels.
during [t₁+1, t₂]:        primary_cancel₁ = 0;
during [t₂+1, t₃]:        primary_cancel₂ = 0;
during [t₃+1, t₄]:        primary_cancel₃ = 0;
//For all registers that get updated, prove their correct
//handling in the pipeline.
at       t₃:              if result_valid_R,3 = 1
                            then next(result_valid_R,4) = 1
                          end if;
during [t₂+1, t₃]:        result_write_R,3 = 1;
during [t₃+1, t₄]:        result_write_R,4 = 1;
during [t₂+1, t₃]:        result_dest_R,3 = index₁,R;
during [t₃+1, t₄]:        result_dest_R,4 = index₁,R;
during [t₂+1, t₃-1]:      if (result_valid_R,3 = 1)
                            then next(result_valid_R,3) = 1
                          end if;
during [t₃+1, t₄-1]:      if (result_valid_R,4 = 1)
                            then next(result_valid_R,4) = 1
                          end if;
during [t₂+1, t₃]:        if (result_valid_R,3)
                            then result_data_R,3 = update₁,R;
                          end if;
during [t₃+1, t₄]:        if (result_valid_R,4)
                            then result_data_R,4 = update₁,R;
                          end if;
at t₄+1:                  current_R(index_R) = update₁,R
//there is no register in this example that does not get updated.
//the architecture description contains DMEM_IDLE
at t_da:                  dbus_idle;
left_hook:                t0;
right_hook:               t1;
end property;
```

The instantiation of this property makes the proof part of the partial property add_instruction.fetch and add_instruction.validate_regs equal, which mean that the proof of the partial property add_instruction.validate_regs is skipped.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method performed by a computer for formally verifying the equivalence of an architecture description with an implementation description, the method comprising the steps of:
reading, by the computer, an implementation description;
reading, by the computer, an architecture description, wherein the architecture description takes a view of the processor in which the processor executes every instruction fully before the processor starts with the next instruction;
demonstrating, by the computer, that during execution of a same program with same initial values an architecture sequence of data transfers described by the architecture description is mappable to an implementation sequence of data transfers implemented by the implementation description, such that the mapping is bijective and ensures that the temporal order of the architecture sequence of data transfers corresponds to the temporal order of the implementation sequence of data transfers; and outputting, by the computer, a result of the verification of the equivalence of the architecture description with the implementation description.

2. A method according to claim 1, wherein the mapping of the architecture sequence of data transfers to the implementation sequence of data transfers comprises ensuring that the same data is transferred from or to same address of a data memory.

3. A method according to claim 1, wherein the implementation sequence of data transfers is described by an access protocol description.

4. A method according to claim 1, whereby the step of demonstrating comprises:

during the execution of the same program, behaviour of interrupt signals of the implementation description is demonstrated to be mappable to behaviour of interrupt signals of the architecture description such that the mapping of the architecture sequence signals of data transfers with the mapped interrupt signals corresponds to the implementation sequence of data transfers influenced by the interrupt signals.

5. A method according to claim 1, wherein the step of demonstrating comprises the steps of:

reading correspondence information; and generating a plurality of demonstration steps using the read correspondence information, wherein one of the demonstration steps verifies a correspondence of the architecture description with the implementation description subsequent to the execution of a cycle of the same program.

6. A method according to claim 5, wherein the method uses the correspondence information in a way such that the method does not output a false verification for a non-equivalent pair of the architecture description and the implementation description.

7. A method according to claim 5, wherein the correspondence information includes stall conditions of one or multiple pipeline stages of the implementation description.

8. A method according to claim 5, wherein the correspondence information includes cancel conditions of one or multiple pipeline stages of the implementation description.

9. A method according to claim 5 wherein the correspondence information includes a classification of one or more of pipeline stages of the implementation description.

10. A method according to claim 5, wherein the correspondence information includes a function for reading a program counter from the implementation description.

11. A method according to claim 5, wherein the correspondence information comprises one or more virtual registers for mapping values in implementation registers of the implementation description to corresponding architectural registers of the architectural description.

12. A method according to claim 11, wherein the one or more virtual registers are functions for testing one or more pipeline stages of the implementation description in the order of an instruction sequence, wherein the one or more virtual registers return at least one pipeline value from one of the one or more pipeline stages having relevant data and wherein the one or more virtual registers return, if none of the one or more pipeline stages have relevant data, the value of the implementation register implementing the corresponding architecture register.

13. A method according to claim 12, wherein the one or more virtual registers are functions generated from one or more sub-functions.

14. A method according to one of claims 11 wherein the virtual registers are organized in virtual register files.

15. A method according to claim 5, wherein the step of generating the plurality of demonstration steps comprises the steps of:

generating properties; and verifying the generated properties to either prove all of the generated properties or to identify at least one false one of the generated properties.

16. A method according to claim 15, wherein the step of generating properties comprises the steps of:

accessing a property schemata including one or more place holders; and replacing the one or more place holders with values from the correspondence information, to thereby generate at least one generated property.

17. A method according to claim 15, wherein the method ceases on the identification of at least one false one of the generated properties.

18. A method according to claim 15, wherein a subset of the generated properties is created, such that each member property of the subset describes an execution of one of an implementation cycle.

19. A method according to claim 18, wherein the implementation cycle is either an instruction executed by the implementation description or an interrupt executed by the implementation description.

20. A method according to claim 18, wherein the subset of the generated properties indicates changes in one or more virtual registers as a result of the execution of the implementation cycles.

21. A method according to claim 18, wherein the subset of the generated properties consists of properties to verify how the implementation requests an instruction, when and how the implementation changes a program counter; if, when and how instruction in the pipeline are cancelled; if, when and which ones of the data transfers of the implementation description are carried out by the implementation; that subsequent to the execution of the instruction the implementation is in a state from which it executes a further implementation cycle.

22. A method according to claim 5, wherein the step of reading the implementation description comprises reading a first portion of the implementation description, the step of reading the architecture description comprises reading a first portion of the architecture description, and the method further comprises the step of:

using the correspondence information to verify the equivalence of the first portion of the implementation description with the first portion of the architecture description and, if the equivalence is demonstrated, reading in a further portion of the implementation description and a further portion of the architecture description.

23. A method according to claim 15, wherein for each one of an implementation cycle there exists at least one property describing the implementation cycle.

24. A method according to claim 1, wherein the demonstration further comprises checking that each one of cycles of the same program is implemented by a finite number of implementation clock cycles.

25. A method according to claim 24, wherein the cycle of the same program comprises an instruction or an interrupt.

26. A method according to claim 1, wherein the result comprises one of: indication of the proof of all of the generated properties, confirmation of the equivalence of the architecture description and the implementation description, and an indication that one of the generated properties is false or a list of the false ones of the generated properties.

27. A method according to claim 1, wherein the architectural description is an architecture description of a processor and the implementation description is the implementation description of a processor.

28. A method performed by a computer for verifying the equivalence of an architecture description with an implementation description, the method comprising the steps of:
reading, by the computer, an implementation description;
reading, by the computer, an architecture description, wherein the architecture description takes a view of the processor in which the processor executes every instruction fully before the processor starts with the next instruction;
reading, by the computer, correspondence information;
generating, by the computer, a set of properties;
verifying, by the computer, the set of properties to either show that all of the generated properties hold or to identify at least one false one of the generated properties wherein the verifying demonstrates that during execution of a same program with same initial values an architecture sequence of data transfers described by the architecture description is mapped to an implementation sequence of data transfers implemented by the implementation description, such that the mapping is bijective and ensures that the temporal order of the architecture sequence of data transfers corresponds to the temporal order of the implementation sequence of data transfers; and
outputting, by the computer, a result of the verification of the equivalence of the architecture description with the implementation description.

29. A method according to claim 28, wherein the verifying the set of properties comprises simulating the implementation properties on a result of the simulation.

30. A method according to claim 28, wherein the mapping of the architecture sequence of data transfers to the implementation sequence of data transfers comprises ensuring that the same data is transferred from or to same address of a data memory.

31. A method according to claim 28, wherein the implementation sequence of data transfers is described by an access protocol description.

32. A method according to claim 28, whereby the demonstrating comprises:
during the execution of the same program, behaviour of interrupt signals of the implementation description is demonstrated to be mappable to behaviour of interrupt signals of the architecture description.

33. A method according to claim 28, wherein the correspondence information includes stall conditions of one or multiple pipeline stages of the implementation description.

34. A method according to claim 28, wherein the correspondence information includes cancel conditions of one or multiple pipeline stages of the implementation description.

35. A method according to claim 28, wherein the correspondence information includes a classification of one or more of pipeline stages of the implementation description.

36. A method according to claim 28, wherein the correspondence information includes a function for reading a program counter from the implementation description.

37. A method according to claim 28, wherein the correspondence information comprises one or more virtual registers for mapping values in implementation registers of the implementation description to corresponding architectural registers of the architectural description.

38. A method according to claim 37, wherein the one or more virtual registers are functions for testing one or more pipeline stages of the implementation description in the order of an instruction sequence, wherein the one or more virtual registers return at least one pipeline value from one of the one or more pipeline stages having relevant data and wherein the one or more virtual registers return, if none of the one or more pipeline stages have relevant data, the value of the implementation register implementing the corresponding architecture register.

39. A method according to claim 37, wherein the one or more virtual registers are functions generated from one or more sub-functions.

40. A method according to claim 37 wherein the virtual registers are organized in virtual register files.

41. A method according to claim 28, wherein the demonstrating further comprises checking that each one of cycles of the same program is implemented by a finite number of implementation clock cycles.

42. A method according to claim 41, wherein the cycle of the same program comprises an instruction or an interrupt.

43. A method according to claim 28, wherein the step of generating a set of properties comprises:
accessing a property schemata including one or more place holders; and
replacing the one or more place holders with values from the fail-safe correspondence information, to thereby generate at least one generated property.

44. A method according to claim 28, wherein the method ceases on the identification of at least one false one of the generated properties.

45. A method according to claim 28, wherein a subset of the generated properties is created, such that each member property of the subset describes an execution of one of an implementation cycle.

46. A method according to claim 45, wherein the implementation cycle is either an instruction executed by the implementation description or an interrupt executed by the implementation description.

47. A method according to claim 45, wherein the subset of the generated properties indicates changes in one or more virtual registers as a result of the execution of the implementation cycles.

48. A method according to claim 45, wherein the subset of the generated properties consists of properties to verify how the implementation requests an instruction, when and how the implementation changes a program counter; if when and how instructions in the pipeline are cancelled; if, when and which ones of the data transfers of the implementation description are carried out by the implementation; that subsequent to the execution of the instruction the implementation is in a state from which it can be carried out.

49. A method according to claim 28, wherein for each one of an implementation cycle there exists at least one property describing the implementation cycle.

50. A method according to claim 28 wherein the result comprises one of: indication of the proof of all of the generated properties, confirmation of the equivalence of the architecture description and the implementation description, and an indication that one of the generated properties is false or a list of the false ones of the generated properties.

51. A method according to anyone of claims 28, wherein the architectural description is a description of a processor.

52. A method according to claim 28, wherein the reading of the implementation description comprises reading a first portion of the implementation description, the reading of the architecture description comprises reading a first portion of the architecture description, and method further comprises the step of:

using the correspondence information to verify the equivalence of the first portion of the implementation description with the first portion of the architecture description and, if the equivalence is demonstrated reading in a further portion of the implementation description and a further portion of the architecture description.

* * * * *